(12) United States Patent
Takeuchi

(10) Patent No.: US 7,859,322 B2
(45) Date of Patent: Dec. 28, 2010

(54) INTERNAL POWER-SUPPLY CIRCUIT

(75) Inventor: Atsushi Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 217 days.

(21) Appl. No.: 12/187,881

(22) Filed: Aug. 7, 2008

(65) Prior Publication Data

US 2009/0039950 A1    Feb. 12, 2009

(30) Foreign Application Priority Data

Aug. 9, 2007   (JP) .............................. 2007-207500

(51) Int. Cl.
*G05F 1/10* (2006.01)
(52) U.S. Cl. ...................... 327/538; 327/534
(58) Field of Classification Search .......... 327/534–544
See application file for complete search history.

(56) References Cited

U.S. PATENT DOCUMENTS

| 5,554,953 | A |   | 9/1996 | Shibayama et al. |
| 5,656,944 | A | * | 8/1997 | Choi ........................... 324/763 |
| 5,856,756 | A | * | 1/1999 | Sasahara et al. ............. 327/540 |
| 6,072,742 | A | * | 6/2000 | Ooishi ......................... 365/226 |
| 6,333,879 | B1 | * | 12/2001 | Kato et al. ................... 365/201 |
| 7,539,072 | B2 | * | 5/2009 | Kang ........................... 365/201 |
| 2004/0012996 | A1 |   | 1/2004 | Tanizaki |

FOREIGN PATENT DOCUMENTS

| JP | 05-136680 | 6/1993 |
| JP | 06-208791 | 7/1994 |
| JP | 2004-55001 | 2/2004 |

\* cited by examiner

*Primary Examiner*—Dinh T. Le
(74) *Attorney, Agent, or Firm*—Arent Fox, LLP

(57) ABSTRACT

An internal power-supply circuit generates an internal voltage based on a reference voltage, and has an external-power-supply terminal to which an external power-supply voltage having a first potential is applied during a normal operation and an external power-supply voltage having a second potential that is higher than the first potential is applied during a burn-in acceleration test, a reference-voltage generating unit for generating the reference voltage from the external power-supply voltage, and an internal-voltage generating unit for generating the internal voltage based on the reference voltage. The reference-voltage generating unit generates, during the normal operation, a normal reference voltage that is independent of the potential of the external power-supply voltage and generates, during the burn-in acceleration test, a first burn-in reference voltage that is dependent on the potential of the external power-supply voltage and a second burn-in reference voltage that has the same potential as the normal reference voltage.

9 Claims, 20 Drawing Sheets

US 7,859,322 B2

INTERNAL POWER-SUPPLY CIRCUIT

CROSS REFERENCE TO RELATED APPLICATION

This application is based upon and claims the benefit of priority from the prior Japanese Patent Application No. 2007-207500 filed on Aug. 9, 2007, the entire contents of which are incorporated herein by reference.

BACKGROUND

1. Technical Field

This is related to internal power-supply circuits having a reference-voltage generating unit in semiconductor integrated circuits.

2. Description of the Related Art

A semiconductor integrated circuit, for example, a DRAM, has an internal power-supply circuit for generating a internal power-supply step-down voltage from an externally supplied power-supply voltage Vdd, in order to achieve both high speed operation and low power consumption. The internal power-supply step-down voltage causes an internal circuit to operate. The internal power supply circuit also generates an internal power-supply step-up voltage and a bias voltage for current sources, which voltages are higher than the externally supplied power-supply voltage Vdd. It is required that internal voltages generated by the internal power-supply circuit, i.e., an internal power-supply step-up voltage, an internal power-supply step-down voltage, a bias voltage, and so on, have desired potentials. Accordingly, the internal power-supply circuit generates a desired reference voltage from the externally supplied power-supply voltage Vdd, and generates the internal voltages based on the reference voltage.

The internal power-supply step-down voltage is supplied to a peripheral circuit of the DRAM and is also supplied to a memory core having a memory cell array. The internal power-supply step-up voltage is supplied to the memory core. The current-source-bias voltage is supplied to current-source transistors of voltage-detection differential amplifier circuits and a delay circuit in the peripheral circuit to cause the current-source transistors to generate desired currents.

During power up, the internal power-supply circuit monitors the rising of the externally supplied power-supply voltage Vdd, and upon detecting the rising, the internal power-supply circuit starts a reference-voltage generating unit. After a reference voltage is generated, the internal power-supply circuit starts an internal-voltage generating unit that includes an internal power-supply step-down voltage generating circuit, an internal power-supply step-up voltage generating circuit, a current-source-bias generating circuit, and so on. Upon detecting the rising of all internal voltages and internal power-supply voltages, the internal power-supply circuit outputs a start signal indicating that the series of starting internal-power-supply operations has been completed. In response to the start signal, the internal circuit starts operation.

Since the above-described reference voltage is used as a reference voltage for the various internal power-supply voltages and the internal voltages, it is required that the reference voltage has a desired fixed level that is independent of the level of the externally supplied power-supply voltage Vdd. During a burn-in test, however, the potentials of the internal power-supply voltages are controlled so that they are higher than those for the normal operation to cause a defect in the integrated circuit to appear. Thus, it has been proposed that the reference voltage for the burn-in acceleration test is set to have a higher potential than that for the normal operation.

For example, Japanese laid-open patent publication No. 6-208791 discloses a technology in which a DRAM is provided with a first constant-voltage generating circuit for generating a first reference voltage that is independent of an external power-supply voltage and that is used for a normal operation and a second constant-voltage generating circuit for generating a second reference voltage that is dependent on the external power-supply voltage and that is used for a burn-in acceleration test.

Japanese laid-open patent publication No. 2004-55001 discloses a technology in which, during a burn-in test, a reference voltage for a burn-in test instead of a reference voltage used for a normal reading operation is applied to a memory device employing a TMR (tunneling magneto resistance) device. However, the burn-in test reference voltage is applied externally from a tester during the burn-in test.

Japanese laid-open patent publication No. 5-136680 discloses a technology in which a reference voltage during aging is set lower than a reference voltage of a current switch during a normal operation, for a level conversion circuit for a BiCMOS (Bipolar Complementary Metal Oxide Semiconductor) circuit with an ECL (emitter couple logic) interface. This publication is not directly related to the above-described burn-in test reference voltage.

The DRAM disclosed in Japanese laid-open patent publication No. 6-208791 described above is provided with the second constant-voltage generating circuit for generating the second reference voltage that is dependent on the external power-supply voltage and that is used for the burn-in acceleration test. Thus, by performing control to increase the potential of the external power-supply voltage during the burn-in acceleration test, it is possible to make the internal power-supply voltage in the cell array in a memory core to have a higher potential than that for the normal operation. This arrangement makes it possible to cause a defective portion to appear and makes it possible to detect a chip having a potential defect.

SUMMARY OF THE INVENTION

According to one aspect of embodiments, an internal power-supply circuit for generating an internal voltage based on a reference voltage, The internal power-supply circuit including: an external-power-supply terminal to which an external power-supply voltage having a first potential is applied during a normal operation and an external power-supply voltage having a second potential that is higher than the first potential is applied during a burn-in acceleration test; a reference-voltage generating unit for generating the reference voltage having a desired potential from the external power-supply voltage; and an internal-voltage generating unit for generating, upon receiving the reference voltage, the internal voltage based on the reference voltage.

During the normal operation, the reference-voltage generating unit generates a normal reference voltage that is independent of a potential of the external power-supply voltage, and during the burn-in acceleration test, the reference-voltage generating unit generates a first burn-in reference voltage that is dependent on the potential of the external power-supply voltage and a second burn-in reference voltage that has the same potential as the normal reference voltage.

DESCRIPTION OF THE PREFERRED EMBODIMENTS

Embodiments will be described below with reference to the accompanying drawings. However, the technical scope of the present invention is not limited to the embodiments and encompasses features disclosed in the claims and equivalents thereto.

Figure 1:
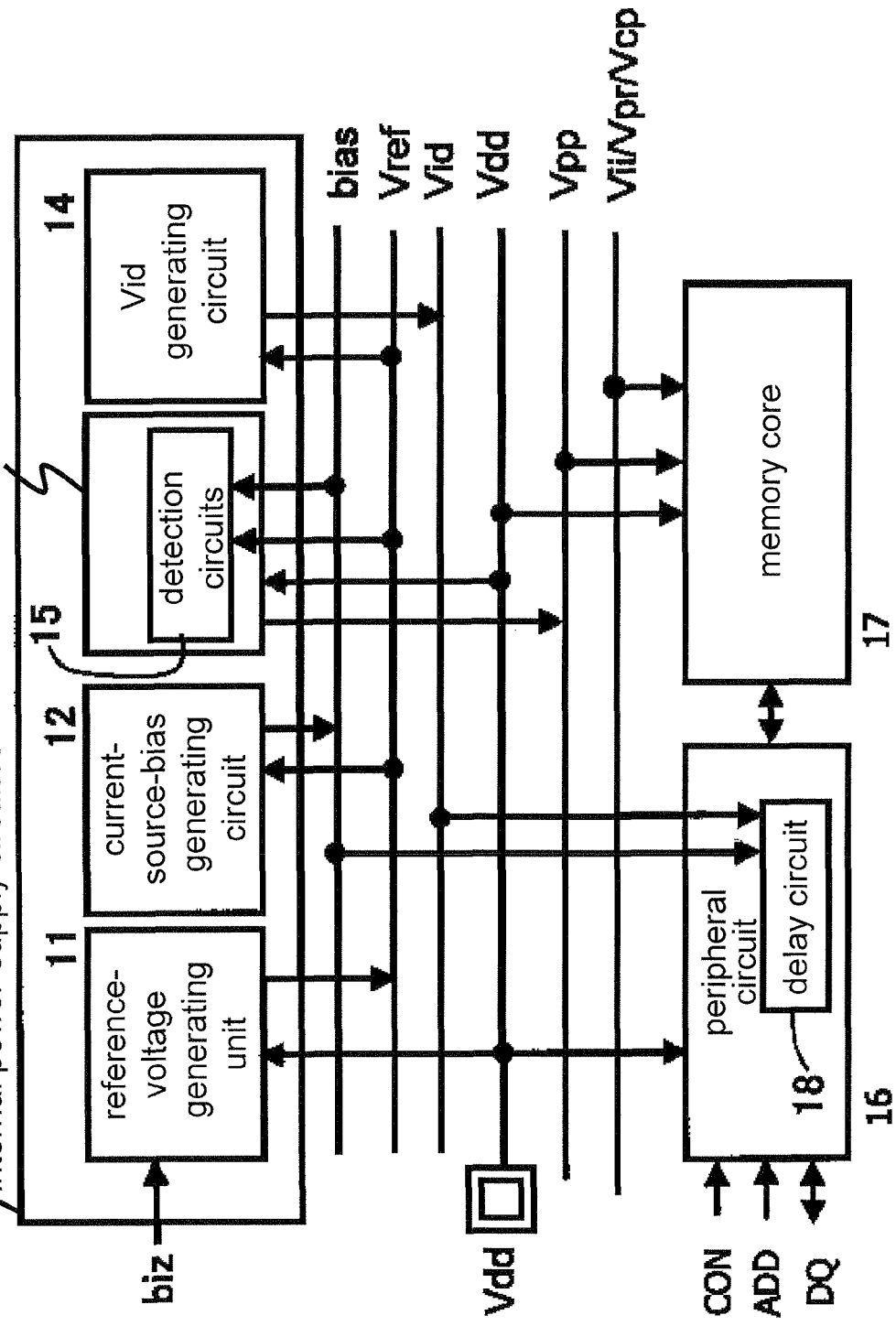
FIG. 1 is a block diagram of a DRAM that is one type of semiconductor integrated circuit.

FIG. 1 is a block diagram of a DRAM that is one type of semiconductor integrated circuit. The DRAM has an internal power-supply circuit 10 that generates internal power from externally supplied power-supply voltage Vdd, a peripheral circuit 16 to which internal voltages bias and Vid generated by the internal power-supply circuit 10 and the externally supplied power-supply voltage Vdd are supplied, and a memory core 17 to which internal power-supply step-down voltages Vii, Vpr, and Vcp and an internal power-supply step-up voltage Vpp are supplied.

The peripheral circuit 16 receives a control signal CON and an address ADD from a memory controller (not shown) and receives or outputs input/output data DQ. The peripheral circuit 16 has a delay circuit 18, which generates a timing signal for operating a circuit in the memory core 17.

The memory core 17 includes a word decoder, a column decoder, a memory cell array, a sense amplifier, and so on.

The internal power-supply circuit 10 has a reference-voltage generating unit 11 for generating a reference voltage Vref having a desired potential from the external power-supply voltage Vdd, a current-source-bias generating circuit 12 for generating a current-source-bias voltage bias from the reference voltage Vref, a power-supply step-up voltage generating circuit (a Vpp generating circuit) 13 for generating an internal power-supply step-up voltage Vpp from the external power-supply voltage Vdd and the reference voltage Vref, and a delay-circuit internal power-supply generating circuit (a Vid generating circuit) 14 for generating delay-circuit internal power-supply voltage Vid from the reference voltage Vref.

The current-source-bias generating circuit 12, the Vpp generating circuit 13, and the Vid generating circuit 14 constitute an internal-voltage generating unit.

Although not shown, the internal power-supply circuit 10 further has an internal power-supply step-down voltage generating circuit (not shown) for generating internal power-supply step-down voltages Vii, Vpr, and Vcp from the external power-supply voltage Vdd and the reference voltage Vref.

The Vpp generating circuit 13 and the internal power-supply step-down voltage generating circuit have therein detection circuits 15 for detecting the levels of the power-supply voltages Vpp and Vii generated thereby. A A burn-in control signal biz is input to the reference-voltage generating unit 11. The level of the burn-in control signal biz goes high during a burn-in acceleration test and goes low during a normal operation.

The internal power-supply step-down voltage Vii has a lower potential than the external power-supply voltage Vdd and the internal power-supply step-down voltages Vpr and Vcp have lower potentials than the internal power-supply step-down voltage Vii. The internal power-supply step-up voltage Vpp has a higher potential than the external power-supply voltage Vdd. The internal circuit is operated with the internal power-supply step-down voltage to thereby allow low power consumption and high speed operation.

Figure 2:
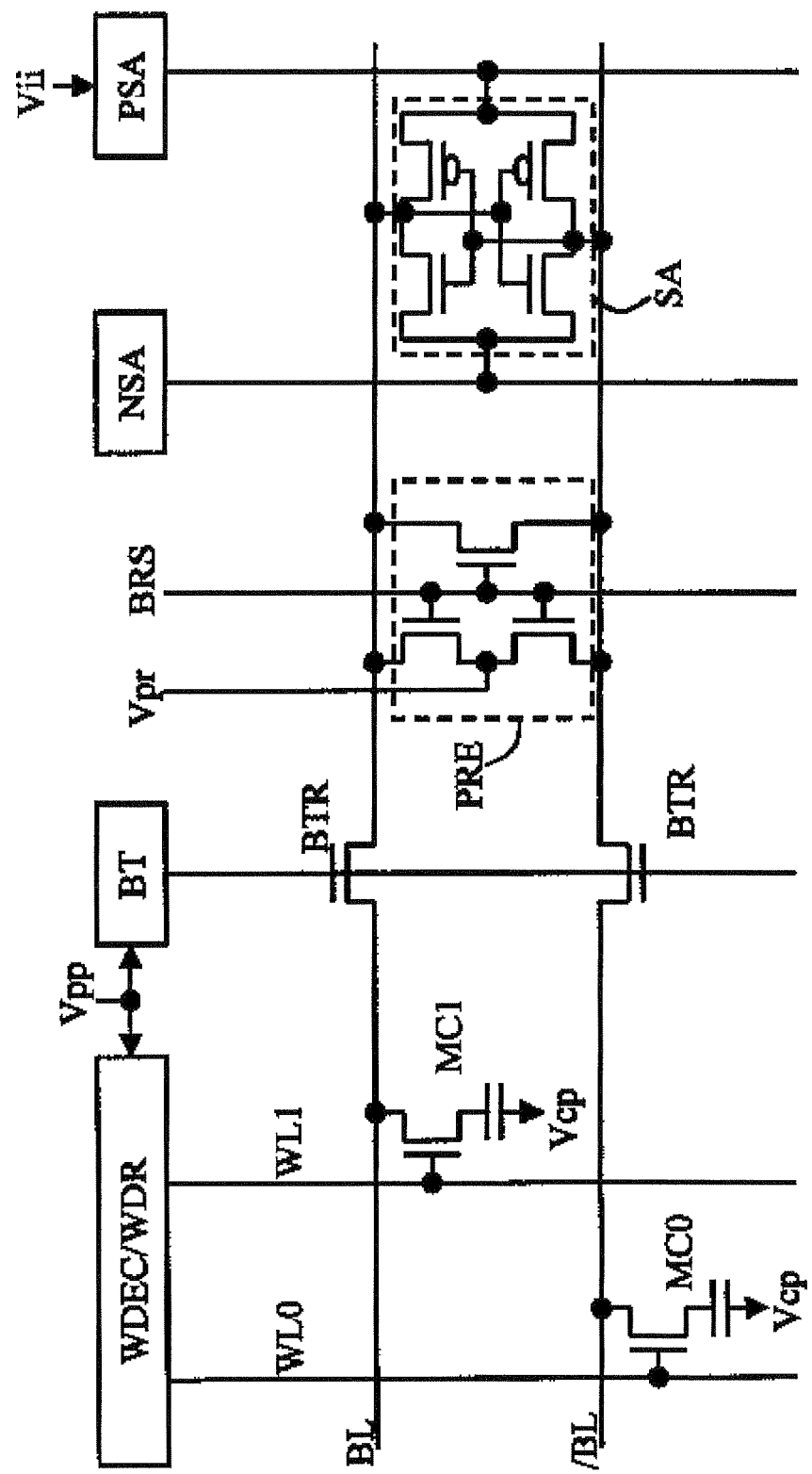
FIG. 2 is a diagram of a memory core in the DRAM.

FIG. 2 is a block diagram of the memory core 17 in the DRAM. The memory core 17 includes word lines WL0 and WL1, a pair of bit lines BL and /BL, a memory cell array having memory cells MC0 and MC1 provided at the intersections of the word and bit lines, a word-decoder/word-driver WDEC/WDR, a bit-line precharge circuit PRE, and a sense amplifier SA. The bit lines BL and /BL are connected to the bit-line precharge circuit PRE and the sense amplifier SA via bit-line transfer transistors BTR and /BTR. The gates of the bit-line transfer transistors BTR and /BTR are controlled by a bit-line transfer drive circuit BT. The sense amplifier SA is driven by an n-channel-side drive circuit NSA and a p-channel-side drive circuit PSA.

The power-supply step-up voltage Vpp generated by the internal power-supply circuit 10 is supplied to the word-decoder/word-driver WDEC/WDR to drive the word lines WL0 and WL1 up to the level of the power-supply step-up voltage Vpp. The bit-line transfer drive circuit BT is also driven by the power-supply step-up voltage Vpp. The internal power-supply step-down voltage Vii is supplied to the p-channel-side drive circuit PSA, and the sense amplifier SA is driven by the internal power-supply step-down voltage Vii and a ground potential Vss.

In contrast, the internal power-supply step-down voltage Vpr is connected to the bit-line precharge circuit PRE and is used for the precharge level of the bit lines BL and /BL. The internal power-supply step-down voltage Vcp is connected to electrodes opposite to the capacitors of the memory cells MC0 and MC1. That is, the internal power-supply step-down voltage Vpr is bit-line precharge power and the internal power-supply step-down voltage Vcp is cell plate power.

The operation of the memory will now be described first, with the bit lines BL and /BL being precharged to have the level of the second internal power-supply step-down voltage Vpr, one of the word lines WL0 and WL1 is driven to have the level of the internal power-supply step-up voltage Vpp and information of the memory cell is read out to the bit lines. In this state, the sense amplifier SA is activated and the potential of one of the bit lines is increased to the internal power-supply step-down voltage Vii and the potential of the other bit line is reduced to the ground potential Vss.

In a burn-in acceleration test, at least the internal power-supply step-up voltage Vpp is set to have a higher potential than that for the normal operation and the word line WL is driven to have a higher potential than that for the normal operation. The driving with the high voltage causes, for example, a defect due to short circuiting between the word line and the bit line to appear. There is also case in which the internal power-supply step-down voltages Vii and Vpr and so on are set to have higher potentials than those for the normal operation to cause a defect to appear. Thus, during the burn-in acceleration test, a testing apparatus controls the potential of the externally supplied power-supply voltage Vdd so that it has a higher potential than that for the normal operation and also controls the reference voltage Vref so that it is higher than that for the normal operation. The detection circuit 15 in the Vpp generating circuit 13 detects the potential of the internal power-supply step-up voltage Vpp based on the reference voltage Vref that is higher than that for the normal operation. Thus, the Vpp generating circuit 13 generates the internal power-supply step-up voltage Vpp that is higher than that for the normal operation.

The circuit configuration of the internal power-supply circuit 10 and the delay circuit 18 shown in FIG. 1 will now be described in detail. A problem of the burn-in acceleration test will be described below.

Figure 3:
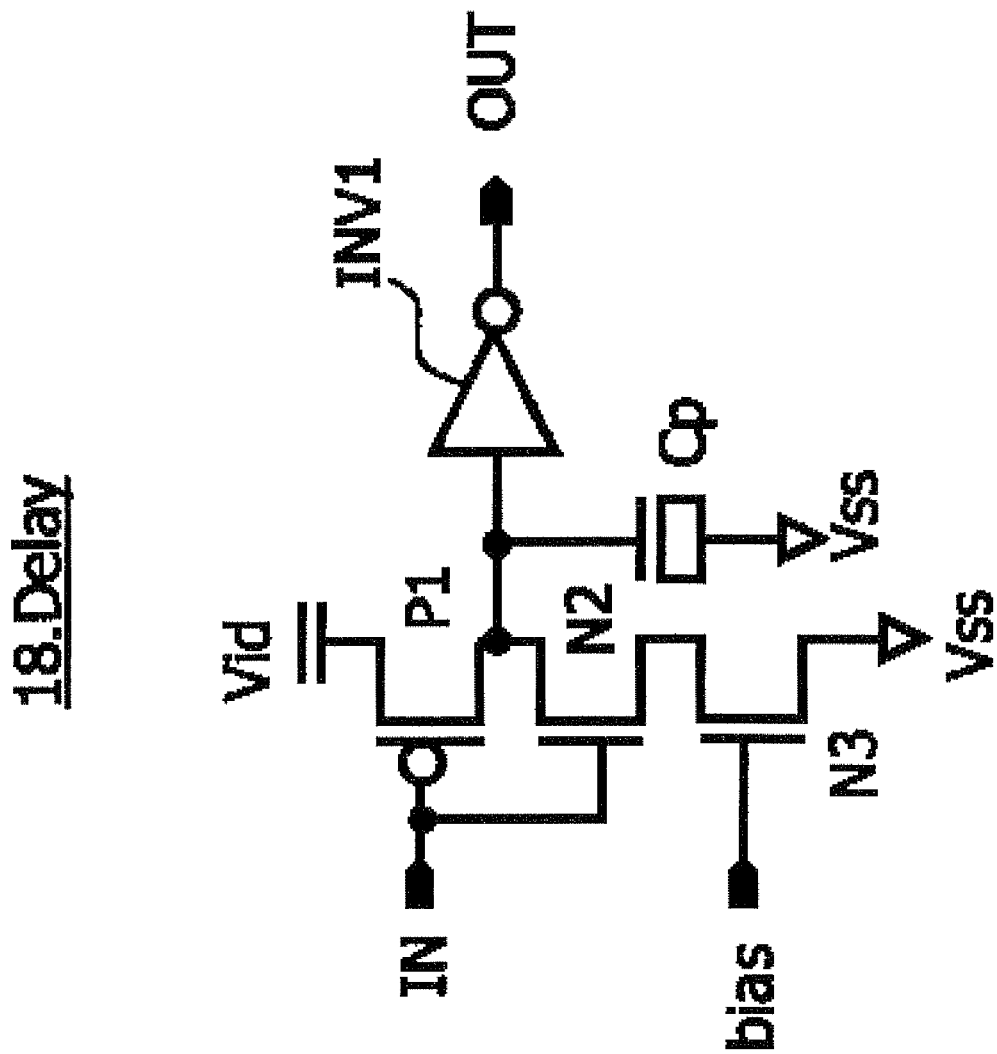
FIG. 3 is a circuit diagram of a delay circuit.

FIG. 3 is a circuit diagram of the delay circuit 18. The delay circuit 18 delays an input signal IN by a predetermined time to output an output signal OUT. For example, the delay circuit 18 receives a first control signal as the input signal IN, and outputs a second control signal as the output signal OUT after a predetermined time. Provision of multiple delay circuits 18 allows multiple control signals to be sequentially generated at predetermined timing. The control signals are used to control the operation timing of the circuit in the memory core 17.

The delay circuit 18 has a CMOS inverter, a current-source transistor N3, a delay capacitor Cp, and an inverter INV1 between the delay-circuit internal power supply Vid and ground Vss. The CMOS inverter includes a p-channel transistor P1 and an n-channel transistor N2. The current-source transistor N3 generates electrical current in accordance with the bias voltage bias. Hereinafter, P is affixed to the reference numeral of a p-channel transistor and N is affixed to the reference numeral of an n-channel transistor.

Upon application of the bias voltage bias, the current-source transistor N3 is brought into conduction to allow generation of a desired current and the CMOS inverter, which includes the transistors P1 and N2, are put into an active state. When the input signal IN is at a low level, the transistor P1 is brought into conduction, so that the delay capacitor Cp is charged to have the potential of the delay-circuit internal power-power voltage Vid. In this state, the output signal OUT is at a low level. When the level of the input signal IN changes to high, the transistor N1 is brought into conduction, so that the value of current flowing thorough the current-source transistor N3 causes the delay capacitor Cp to discharge electricity and the level of the output signal OUT changes to high. Thus, the delay time depends on the potential of the delay-circuit internal power-supply voltage Vid and the potential of the current-source-bias voltage bias.

Figure 4:
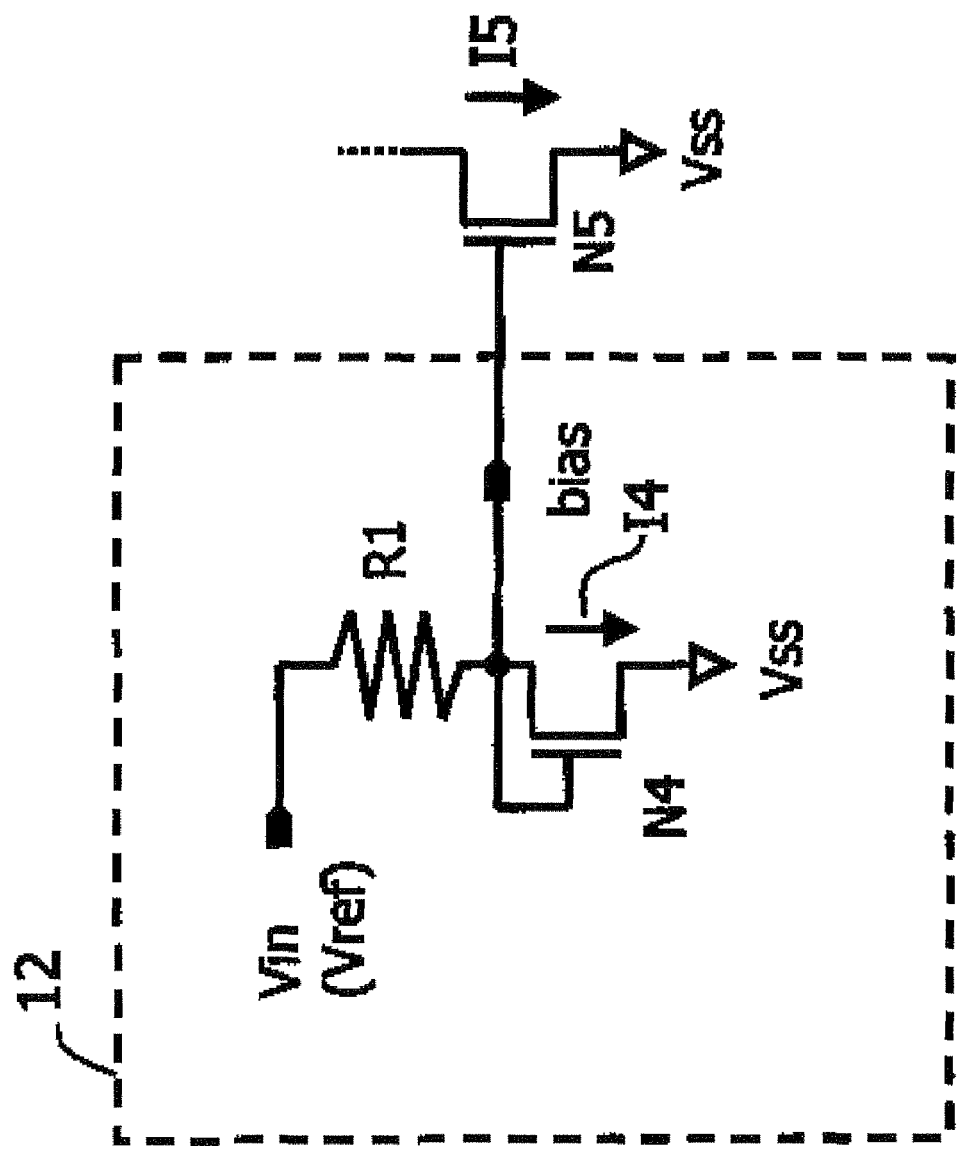
FIG. 4 is a circuit diagram of a current-source-bias generating circuit.

FIG. 4 is a circuit diagram of the current-source-bias generating circuit 12. The current-source-bias generating circuit 12 has a resistor R1 and a diode-connected transistor N4. A constant voltage, i.e., the reference voltage Vref, is applied as an input voltage Vin. Since the transistor N4 is connected to a diode, current I4 that flows through the resistor R1 is given by:

$$I4=(Vin-Vth)/R1$$

where Vth indicates a threshold voltage of the transistor N4.

The bias voltage bias is applied to the gate of a current-source transistor N5. That is, the same bias voltage is applied to the gates of the transistor N4 and N5. Thus, when both transistors N4 and N5 are operating in their saturation regions, the ratio of currents I4 to I5 that flow through the transistors N4 and N5 is given by:

$$I4:I5=(W4/L4):(W5/L5)$$

where the transistor N4 has a gate width W4 and a gate length L4 and the transistor N5 has a gate width W5 and a gate length L5.

That is, the current-source transistor N5 can generate the current I5 that is proportional to the sizes of both transistors N4 and N5.

As described above, the current I4 has the amount of current which depends on the input voltage Vin (the reference Vref). The amount of current of the current-source transistor N5 to which the bias voltage bias is supplied also depends on the input voltage Vin (the reference voltage Vref). Thus, it can be understood that the amount of delay caused by the delay circuit 18 shown in FIG. 3 depends on the reference voltage Vref supplied to the current-source-bias generating circuit 12.

Figure 5:
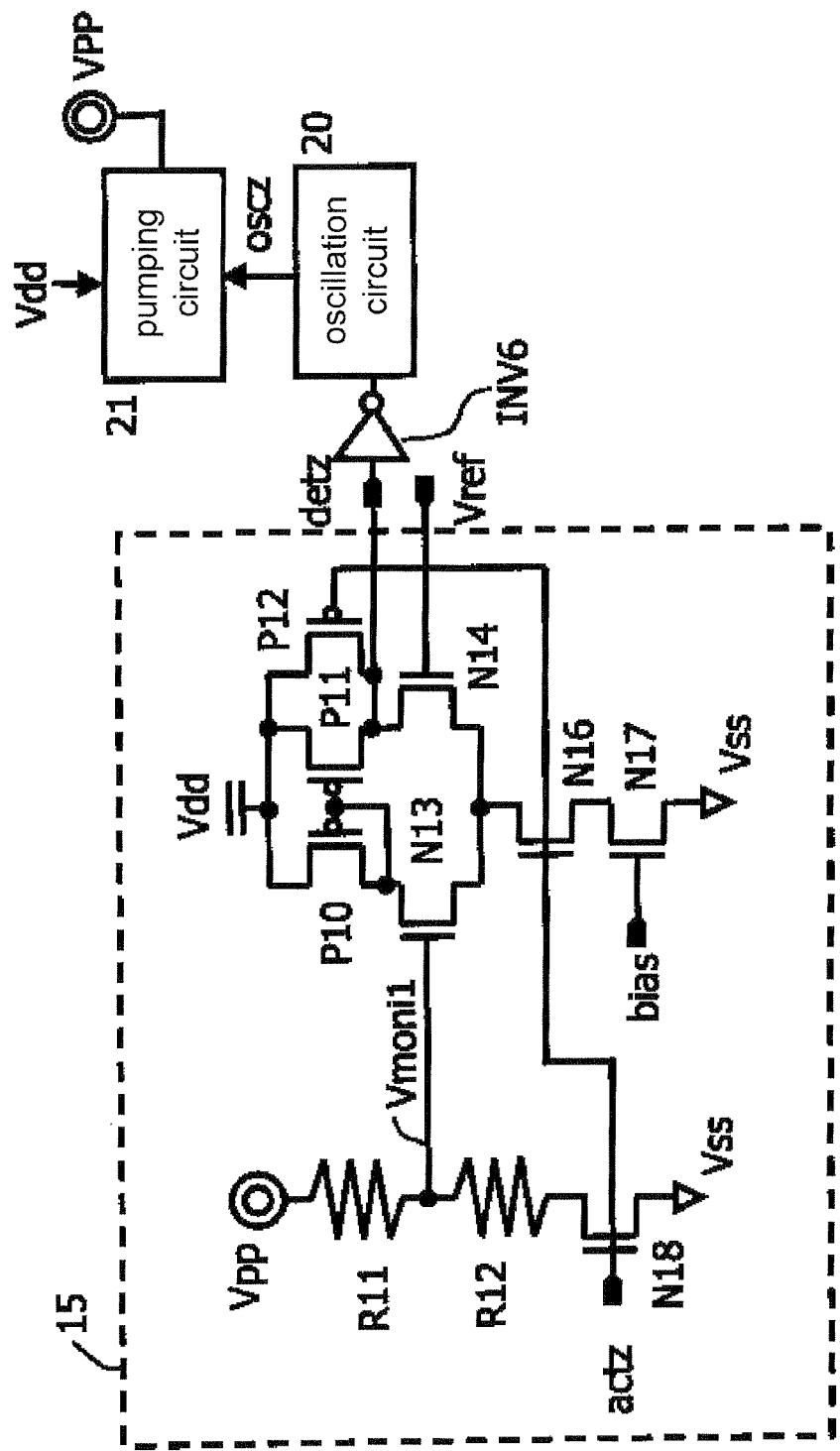
FIG. 5 is a circuit diagram of a Vpp generating circuit.

FIG. 5 is a circuit diagram of the Vpp generating circuit 13. The Vpp generating circuit 13 has the detection circuit 15 that detects whether or not the potential of the internal power-supply step-up voltage Vpp to be generated has a predetermined rate relative to the reference voltage Vref, an oscillation circuit 20 that performs oscillation operation in accordance with a detection output detz of the detection circuit 15, and a pumping circuit 21 that performs pumping operation in response to an oscillation pulse oscz generated by the oscillation circuit 20. In response to the oscillation pulse oscz, the pumping circuit 21 pumps charge from the external power-supply voltage Vdd to increase the potential of the internal power-supply step-up voltage Vpp.

The internal power-supply step-up voltage Vpp output from the pumping circuit 21 is fed back to the detection circuit 15. The detection circuit 15 has a differential amplifier circuit that includes transistors P10, P11, N13, and N14, and a current-source transistor N17. The transistors P10 and P11 constitute a current mirror circuit. The transistors N13 and N14 compares a monitor voltage Vmoni1, obtained by dividing the fed-back internal power-supply step-up voltage Vpp by the resistance ratio of the resistors R11 and R12, with the reference voltage Vref. The bias voltage bias is applied to the gate of the current-source transistor N17. When a drain-source voltage Vds exceeds a saturation voltage, the current source transistor N17 causes a certain amount of current to flow so that the differential amplifier circuit operates with appropriate characteristics. The detection signal detz of the detection circuit 15 is supplied to the oscillation circuit 20 via an inverter INV6.

When an active signal actz is at a low level, the transistor P12 is brought into conduction, transistors N16 and N18 are brought into non-conduction, the detection signal detz is fixed to a high level, and the oscillation operation of the oscillation circuit 20 stops. On the other hand, when the active signal actz is at a high level, the transistors N16 and N18 are brought into conduction, the transistor P12 is brought into non-conduction, and the Vpp generating circuit 13 is put into an active state.

In the active state, the differential amplifier circuit to which the internal power-supply step-up voltage Vpp is fed back compares the monitor voltage Vmoni1 with the reference voltage Vref and generates the detection signal detz so that the monitor voltage Vmoni1 is equal to the reference voltage Vref. Thus, when the potential of the internal power-supply step-up voltage Vpp decreases and the monitor voltage Vmoni1 falls below the reference voltage Vref, the level of the detection signal goes low, the oscillation circuit 20 starts oscillation operation, and the pumping operation of the pumping circuit 21 increases the potential of the power-supply step-up voltage Vpp. Conversely, when the potential of the internal power-supply step-up voltage Vpp increases and the monitor voltage Vmoni1 exceeds the reference voltage Vref, the level of the detection signal detz goes high, the oscillation circuit 20 stops the oscillation operation, and the pumping circuit 21 also stops the pumping operation. As a result, the output Vpp is given by Vpp=Vref*(R43+R44)/R44. Thus, the potential of the internal power-supply step-up voltage Vpp is determined by the reference voltage Vref and the resistance ratio of the resistors R43 and R44.

As described above, the Vpp generating circuit 13 controls the potential of the internal power-supply step-up voltage Vpp in accordance with the potential of the reference voltage Vref. Thus, during the burn-in acceleration test, increasing the potential of the reference voltage Vref makes it possible to perform control so that the potential of the internal power-supply step-up voltage Vpp is high.

Figure 6:
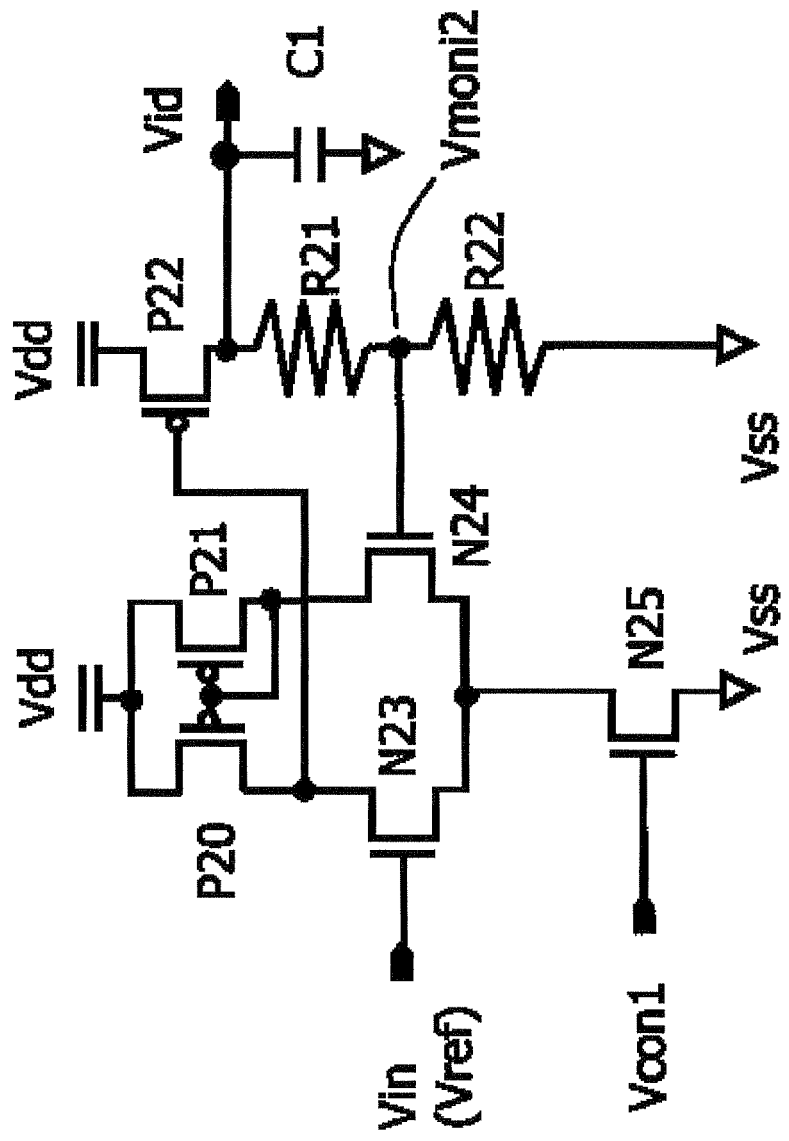
FIG. 6 is a circuit diagram of a delay-circuit internal power-supply generating circuit (Vid generating circuit)

FIG. 6 is a circuit diagram of the delay-circuit internal power-supply generating circuit (the Vid generating circuit) 14. The Vid generating circuit 14 has a differential amplifier circuit that includes transistors P20 and P21, an output transistor P22, transistors N23 and N24, a current-source transistor N25, and resistors R21 and R22. The transistors P20 and P21 constitute a current mirror circuit. The pair of transistors N23 and N24 compares the reference voltage Vref with a monitor voltage Vmoni2. A control signal Vcon1 is supplied to the gate of the current-source transistor N25. The Vid generating circuit 14 further has an output capacitor C1. The control signal Vcon1 has a fixed potential that is independent of the external power-supply voltage Vdd, for example, has a unique potential generated by a band-gap reference circuit (not shown). This causes the transistor N25 to generate a minute amount of current.

The differential amplifier circuit to which the internal power-supply voltage Vid is fed back compares the monitor voltage Vmoni2, obtained by dividing the delay-circuit internal power-supply voltage Vid by the resistance ratio of the resistors R21 and R22, with the reference voltage Vref, and generates the internal power-supply voltage Vid so that the monitor voltage Vmoni2 is equal to the reference voltage Vref. Thus, when the monitor voltage Vmoni2 is higher than the reference voltage Vref, the voltage at the drain node of the transistor N23 increases to bring the transistor P22 into non-conduction. When the monitor voltage Vmoni2 is lower than the reference voltage Vref, the transistor P22 is brought into conduction to increase the internal power-supply voltage Vid. Thus, the power-supply voltage Vid is given by Vid=Vref*(R21+R22)/R22.

As described above, the Vid generating circuit 14 controls the potential of the delay-circuit internal power-supply voltage Vid in accordance with the potential of the reference voltage Vref.

Figure 7:
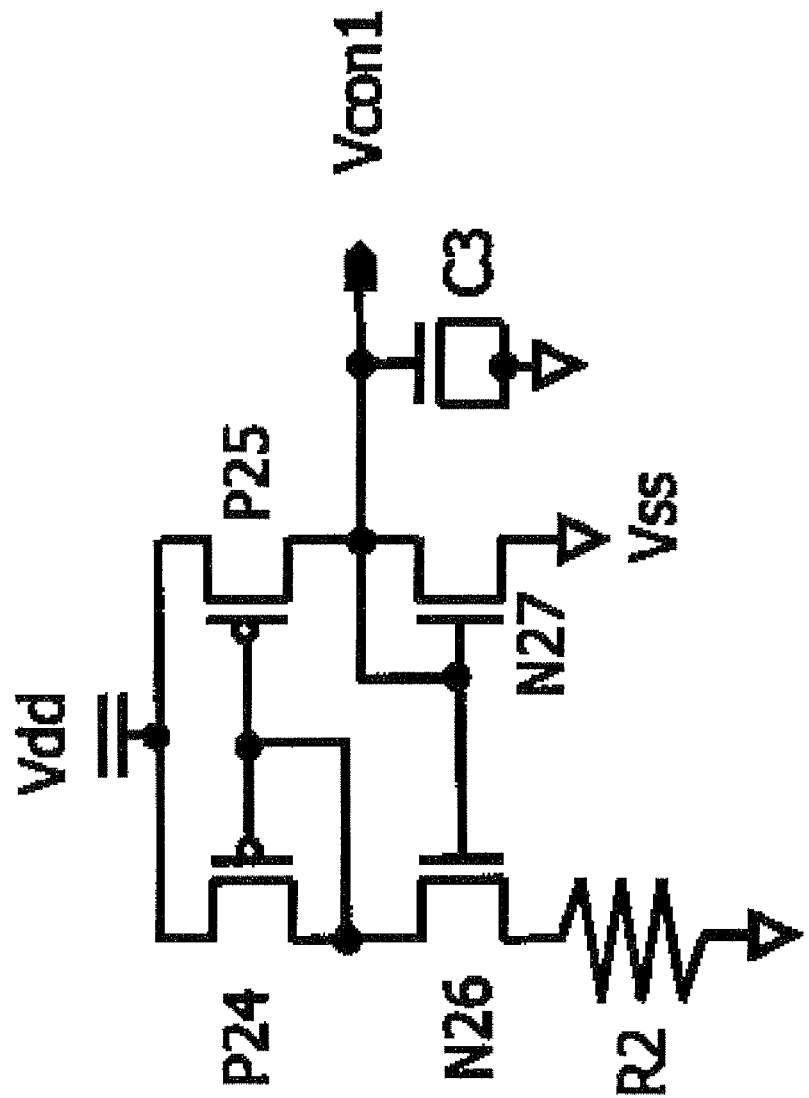
FIG. 7 is a diagram of a circuit for generating a control signal.

FIG. 7 is a diagram of a circuit for generating the control signal Vcon1. This control-signal generating circuit has transistors P24, P25, N26, and N27, a resistor P2, and a stabilizing capacitor C3. The control signal Vcon1 is independent of the potential of the external power-supply voltage Vdd and has a fixed value. As a result, the current-source transistor N25 shown in FIG. 6 generates a minute amount of current.

Figure 8:
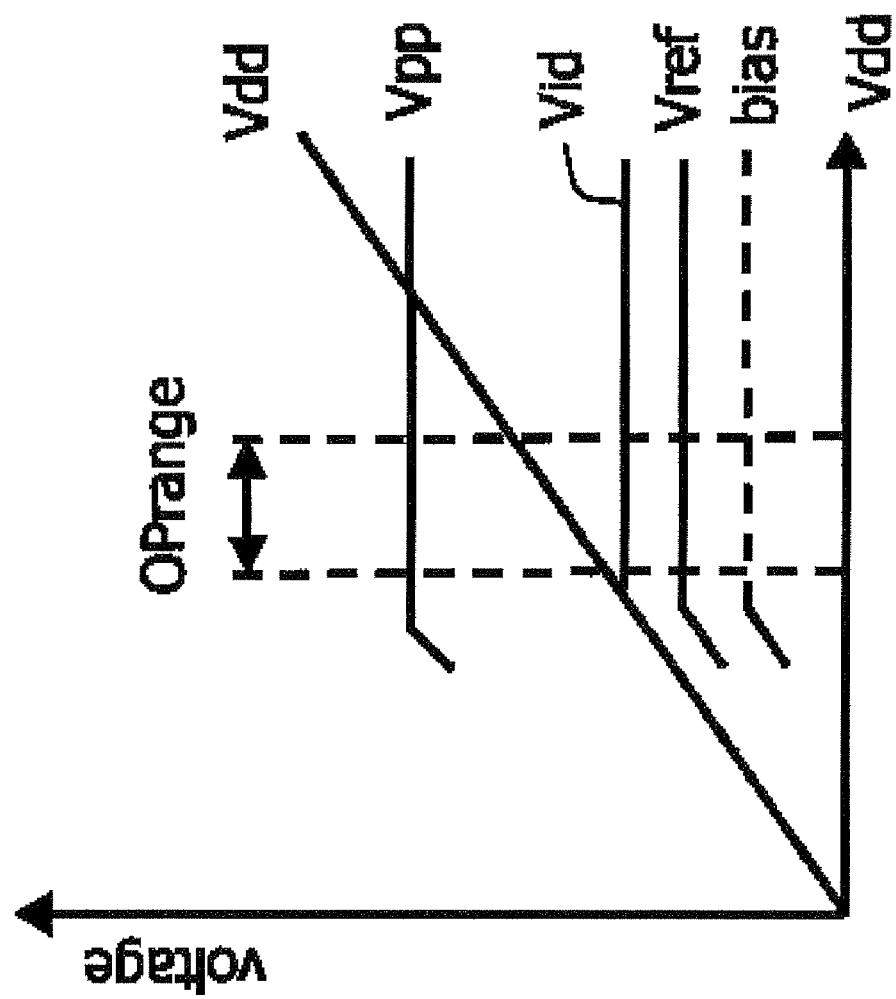
FIG. 8 is a graph showing relationships of an external power-supply voltage and internal power-supply voltages during a normal operation.

FIG. 8 is a graph showing relationships of the external power-supply voltage and the internal power-supply voltages during the normal operation. The horizontal axis indicates the potential of the external power-supply voltage Vdd and the vertical axis indicates the potentials of the internal power-supply voltages and internal voltages. When the external power-supply voltage Vdd increases in the horizontal axis, the external power-supply voltage Vdd also increases in the vertical direction. In an operation range OPrange, the reference voltage Vref has a constant potential. Thus, the internal voltages, such as the internal power-supply step-up voltage Vpp, the bias voltage bias, and the delay-circuit internal power-supply voltage Vid, which are generated based on the reference voltage Vref, also controlled to have constant values. Adjusting the resistance ratio of the feedback circuit allows generation of a reference voltage Vref having multiple potential levels, and in practice, allows a DRAM to generate a reference voltage Vref having multiple potential levels.

Figure 9:
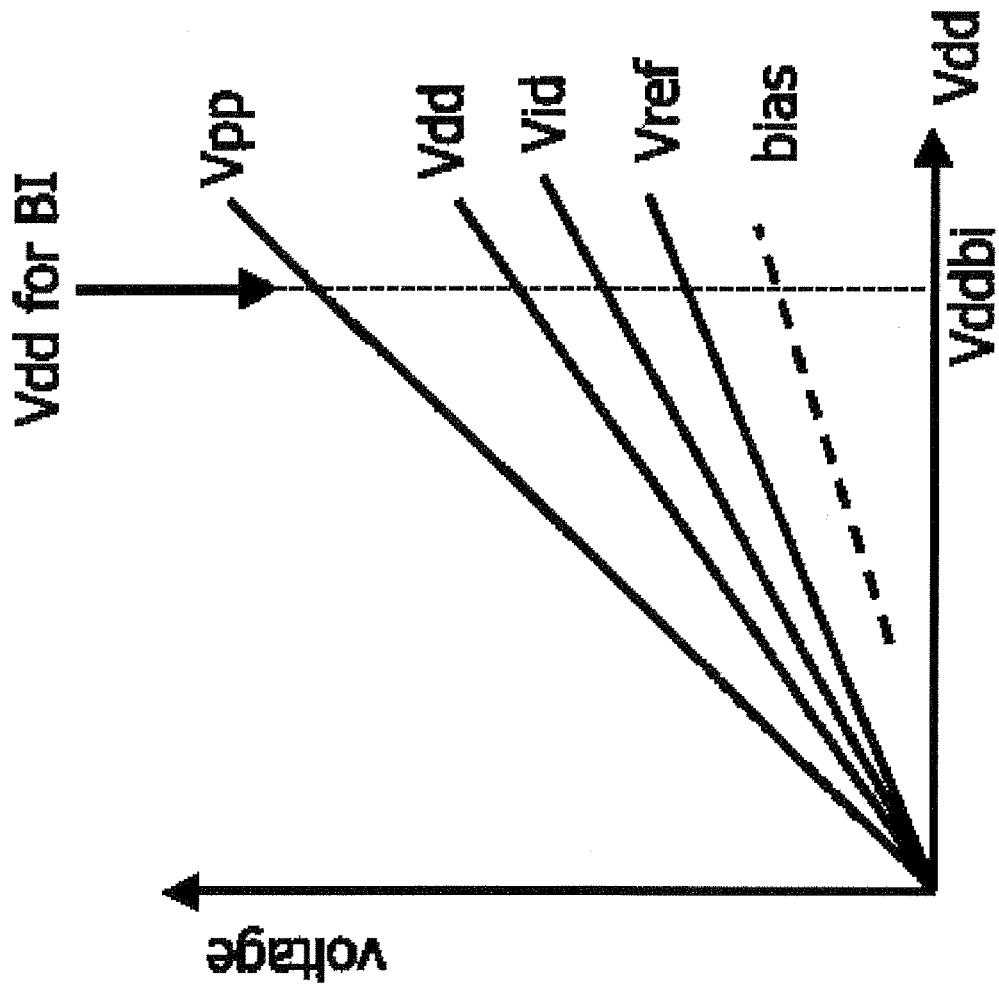
FIG. 9 is a graph showing relationships of the external power-supply voltage and the internal power-supply voltages during a burn-in acceleration test.

FIG. 9 is a graph showing relationships of the external power-supply voltage and the internal power-supply voltages during the burn-in acceleration test. In the burn-in acceleration test, it is necessary to apply a voltage higher than a normally applied voltage to a semiconductor integrated circuit in order to accelerate a potential factor of a defect in the semiconductor integrated circuit to cause a defect to appear. Thus, in the burn-in acceleration test, as shown in FIG. 9, the external power-supply voltage Vdd is controlled so that it reaches a burn-in external power-supply voltage Vddbi that is higher than the range OPrange during the normal operation and the reference voltage Vref is also controlled so that it becomes high based on the external power-supply voltage Vddbi. Thus, controlling the external power-supply voltage Vdd so that it has an appropriate high potential allows the potential of the internal power-supply step-up voltage Vpp generated based on the high reference voltage Vref to have an appropriate high potential. As a result, for example, the internal power-supply step-up voltage Vpp serves as a power-supply voltage for setting word lines in the DRAM. Thus, performing control so that the internal power-supply step-up voltage Vpp is high makes it possible to appropriately perform the burn-in acceleration test.

Figure 10:
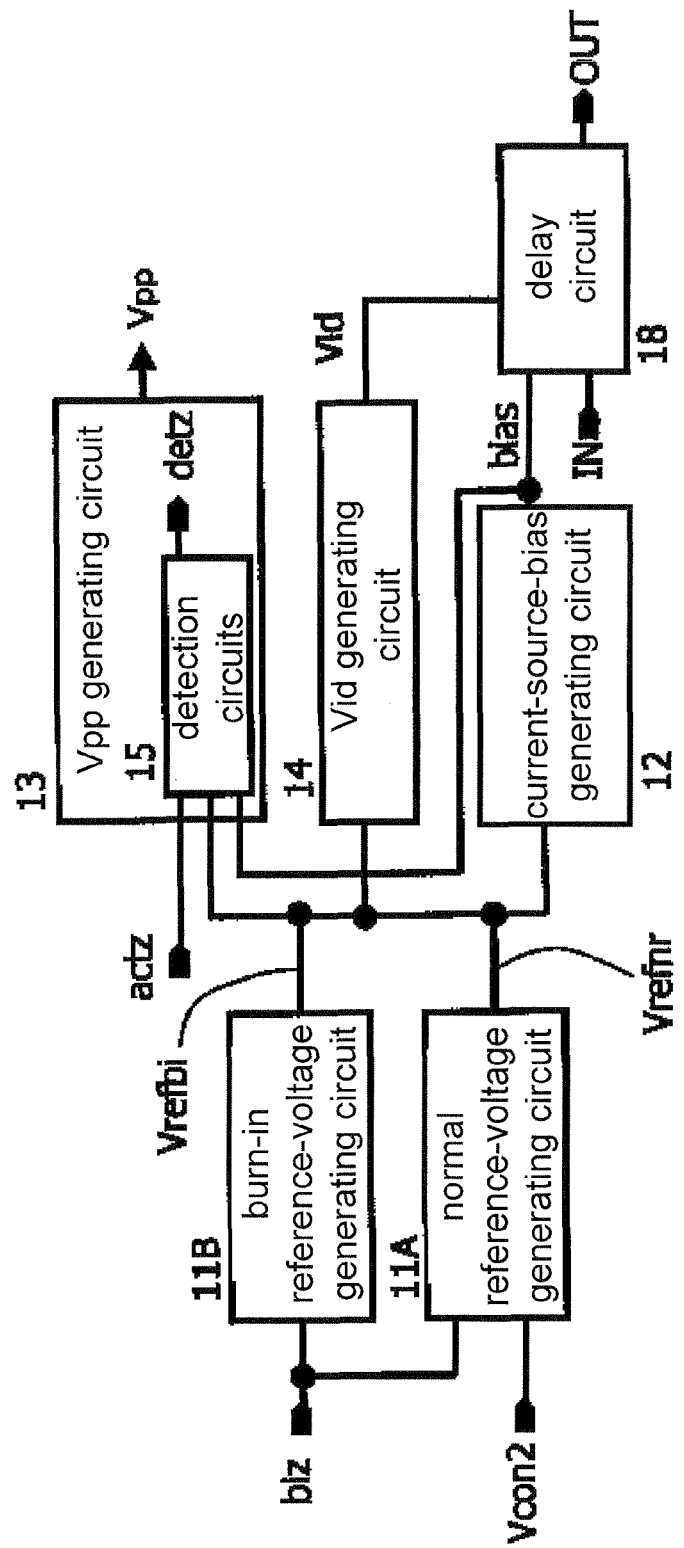
FIG. 10 is a block diagram of an internal power-supply circuit that enables the burn-in acceleration test.

FIG. 10 is a block diagram of an internal power-supply circuit that enables the burn-in acceleration test. In this internal power-supply circuit, the reference-voltage generating unit 11 has a normal-reference-voltage generating circuit 11A and a burn-in reference voltage generating circuit 11B. The normal-reference-voltage generating circuit 11A generates a normal reference voltage Vrefnr that is independent of the external power-supply voltage Vdd and the burn-in reference voltage generating circuit 11B generates a burn-in reference voltage Vrefbi that is dependent on the external power-supply voltage Vdd. The reference-voltage generating circuits 11A and 11B are activated by the burn-in control signal biz (which has a low level during the normal operation and a high level during the burn-in acceleration test)

During the normal operation, the normal-reference-voltage generating circuit 11A is activated to generate the normal reference voltage Vrefnr and the burn-in reference voltage generating circuit 11B is deactivated. On the other hand, during the burn-in acceleration test, the normal-reference-voltage generating circuit 11A is deactivated and the burn-in reference voltage generating circuit 11B is activated to generate the burn-in reference voltage Vrefnr having a potential that is dependent on the external power-supply voltage Vdd.

As described above, the reference voltage is supplied to the internal-voltage generating unit that includes the Vpp generating circuit 13, the Vid generating circuit 14, and the current-source-bias generating circuit 12. The bias voltage bias is supplied to the detection circuit 15 in the Vpp generating circuit 13 and the delay circuit 18, and the delay-circuit internal power-supply voltage Vid is supplied to the delay circuit 18. During the normal operation, the reference voltage becomes the normal reference voltage Vrefnr that is independent of the external power-supply voltage Vdd, and based on the normal reference voltage Vrefnr, the internal power-supply step-up voltage Vpp, the delay-circuit internal power-supply voltage Vid, and the bias voltage bias are generated. On the other hand, during the burn-in acceleration test, the reference voltage becomes the burn-in reference voltage Vrefbi that is dependent on the external power-supply voltage Vdd, and based on the burn-in reference voltage Vrefbi, the internal power-supply step-up voltage Vpp is generated. During the burn-in acceleration test, the external power-supply voltage Vdd is controlled so that it is higher than that for the normal operation; therefore, the burn-in reference voltage Vrefbi and the internal power-supply step-up voltage Vpp also have higher potentials. With this arrangement, it is possible to apply stress caused by the higher voltage than that for the normal operation to the memory core to perform acceleration test.

Figure 11:
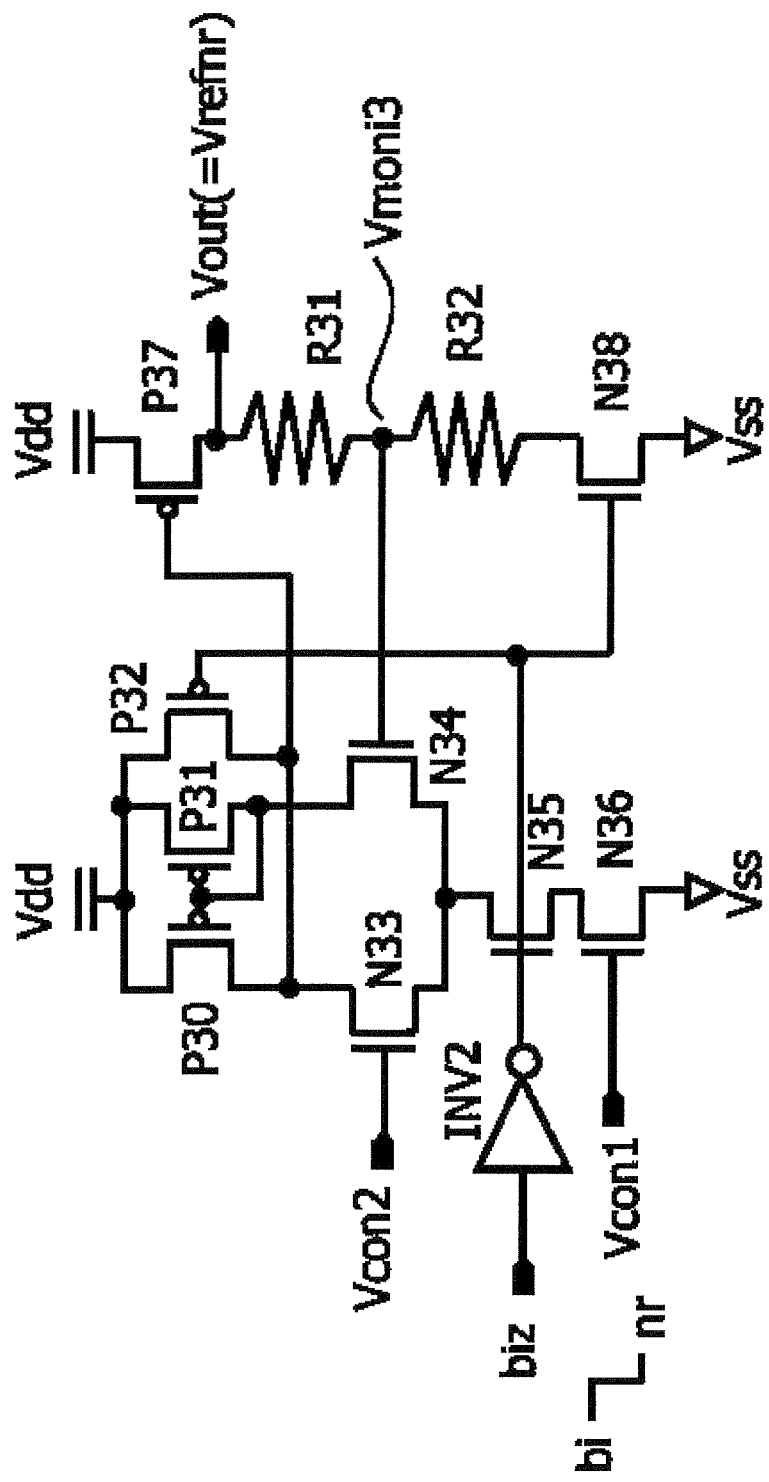
FIG. 11 is a circuit diagram of a normal-reference-voltage generating circuit.

FIG. 11 is a circuit diagram of the normal-reference-voltage generating circuit 11A. The reference-voltage generating unit 11 has a differential amplifier circuit and a feedback circuit. The differential amplifier circuit has transistors P30 and P31 that constitute a current mirror circuit, a pair of transistors N33 and N34 that compares a fixed voltage Vcon2 with a monitor voltage Vmoni3, a current-source transistor N36 having a gate to which the control signal Vcon1 is supplied, and an output transistor P37. The feedback circuit includes resistors R31 and R32. The normal-reference-voltage generating circuit 11A further has transistors P32, N35, and N38 that are controlled by the burn-in control signal biz.

During the normal operation, the level of the burn-in control signal biz goes low and the normal-reference-voltage generating circuit 11A is activated. The differential amplifier circuit having the feedback circuit drives and controls the output transistor P37 so that the monitor voltage Vmoni3 obtained by dividing the output normal reference voltage Vrefnr by the resistance ratio R31:R32 is equal to the fixed voltage Vcon2. As a result, the output normal reference voltage Vrefnr is controlled so as to satisfy Vrefnr=Vcon2*(R31+R32)/R32. That is, adjusting the resistance ratio of the resistors R31 and R32 allows the normal reference voltage Vrefnr to have a desired potential and to be independent of the external power-supply voltage Vdd. Since the output impedance of the output transistor P37 is low, the input impedance of a power-supplied circuit to which the output Vout is supplied may be high or low.

On the other hand, during the burn-in acceleration test, the level of the burn-control signal biz goes high, the output of the inverter INV2 goes low, the transistor P32 is brought into conduction, the transistors P37 and P38 are brought into non-conduction, and the output Vout is put into a high impedance state.

Figure 12:
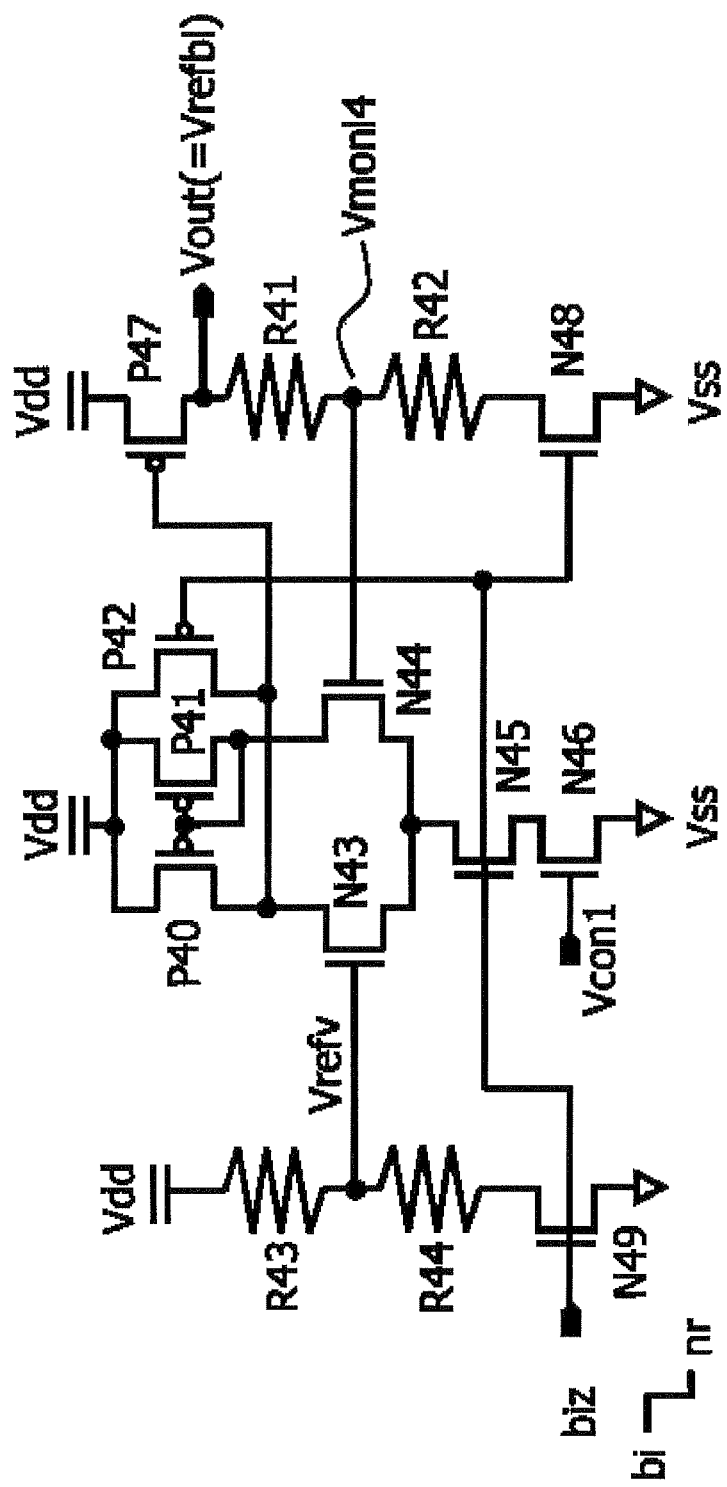
FIG. 12 is a circuit diagram of a burn-in reference voltage generating circuit.

FIG. 12 is a circuit diagram of the burn-in reference voltage generating circuit 11B. Similarly to the normal-reference-voltage generating circuit 11A shown in FIG. 11, the burn-in reference voltage generating circuit 11B has a differential amplifier circuit that includes transistors P40, P41, N43, N44, N46, and P47 and a feedback circuit that includes resistors R41 and R42. However, a reference voltage Vrefv has a potential obtained by dividing the external power-supply voltage Vdd by the resistance ratio of the transistors R43 and R44. Thus, when the level of the burn-in control signal biz goes high during the burn-in acceleration test, the transistors N48 and N49 are brought into conduction, the transistor P42 is brought into non-conduction, and the reference voltage Vrefv has a potential that is dependent on the external power-supply voltage Vdd. By setting the external power-supply voltage Vdd to have a burn-in level Vddbi that is higher than that for the normal operation, it is possible to increase the reference voltage Vrefv. Thus, it is possible to perform control so that the burn-in reference voltage Vrefbi has a higher potential that the normal reference voltage Vrefnr.

Since the reference voltage Vrefv is given by Vrefv=Vdd*R44/(V43+V44), the burn-in reference voltage Vrefbi is given by Vrefbi=Vdd*R44*(R41+R42)/(R43*R44)/R42. That is, the burn-in reference voltage Vrefbi has a potential that is dependent on the external power-supply voltage Vdd.

On the other hand, the level of the burn-in control signal biz goes high during the normal operation, the transistors P47 and N48 are brought into non-conduction and the output Vout is put into a high impedance state. The burn-in reference voltage generating circuit in FIG. 12 has low output impedance, similarly to the circuit shown in FIG. 11, and the input impedance of a circuit to which the burn-in reference Vrefbi is supplied may be high or low.

Figure 13:
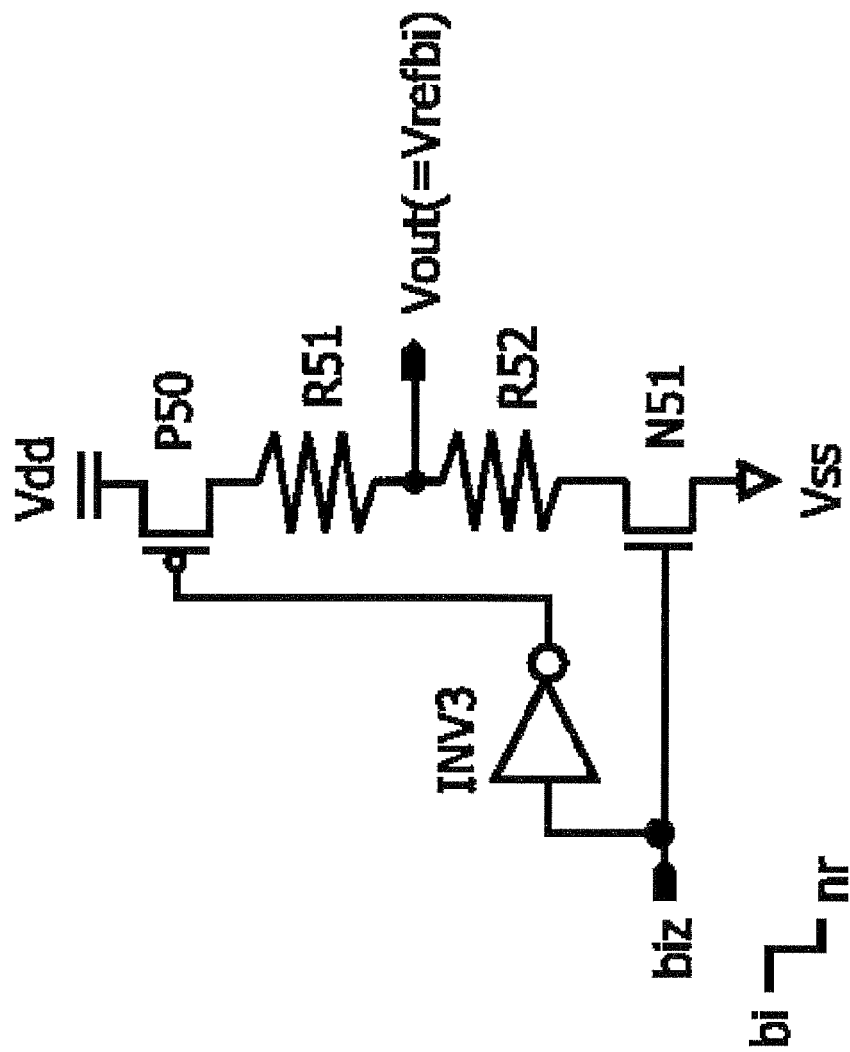
FIG. 13 is another circuit diagram of the burn-in reference voltage generating circuit.

FIG. 13 is another circuit diagram of the burn-in reference voltage generating circuit 11B. In this circuit example, a transistor P50, resistors R51 and R52, and a transistor N51 are provided between the external power supply Vdd and ground Vss, and the burn-in control signal biz is supplied to the gate of the transistor N51 and is supplied to the gate of the transistor P50 via an inverter INV3. During the burn-in acceleration test, the transistors P50 and N51 are brought into conduction and the burn-in reference voltage Vrefbi has a potential that is a multiple of the resistance ratio of the (Vdd-Vss) resistors R51 and R25. That is, Vrefbi=Vdd*R52/(R51+R52) is given and the burn-in reference voltage Vrefbi has a potential that is dependent on the external power-supply voltage Vdd. On other hand, since the level of the burn-in control signal biz goes high during the normal operation, the transistors P50 and N51 are brought into non-conduction and the output Vout is put into a high impedance state.

In the burn-in reference voltage generating circuit shown in FIG. 13, the resistors R51 and R52 increase the output impedance of the output terminal Vout. Thus, it is required that the input impedance of a circuit to which the burn-in reference voltage Vrefbi is supplied be high. However, the burn-in reference voltage generating circuit can operate even when then number of devices is reduced, the resistances of the resistors R51 and R52 are increased, and the circuit area is reduced. Thus, the area occupied by the generating circuit can be reduced.

Referring back to FIGS. 9 and 10, during the burn-in acceleration test, the burn-in reference voltage generating circuit 11B is operated to generate the burn-in reference voltage Vrefbi that is dependent on the external power-supply voltage Vdd. This arrangement can increase the internal power-supply step-up voltage Vpp to be higher than that for the normal operation and can apply an appropriate stress to devices.

Figure 15:
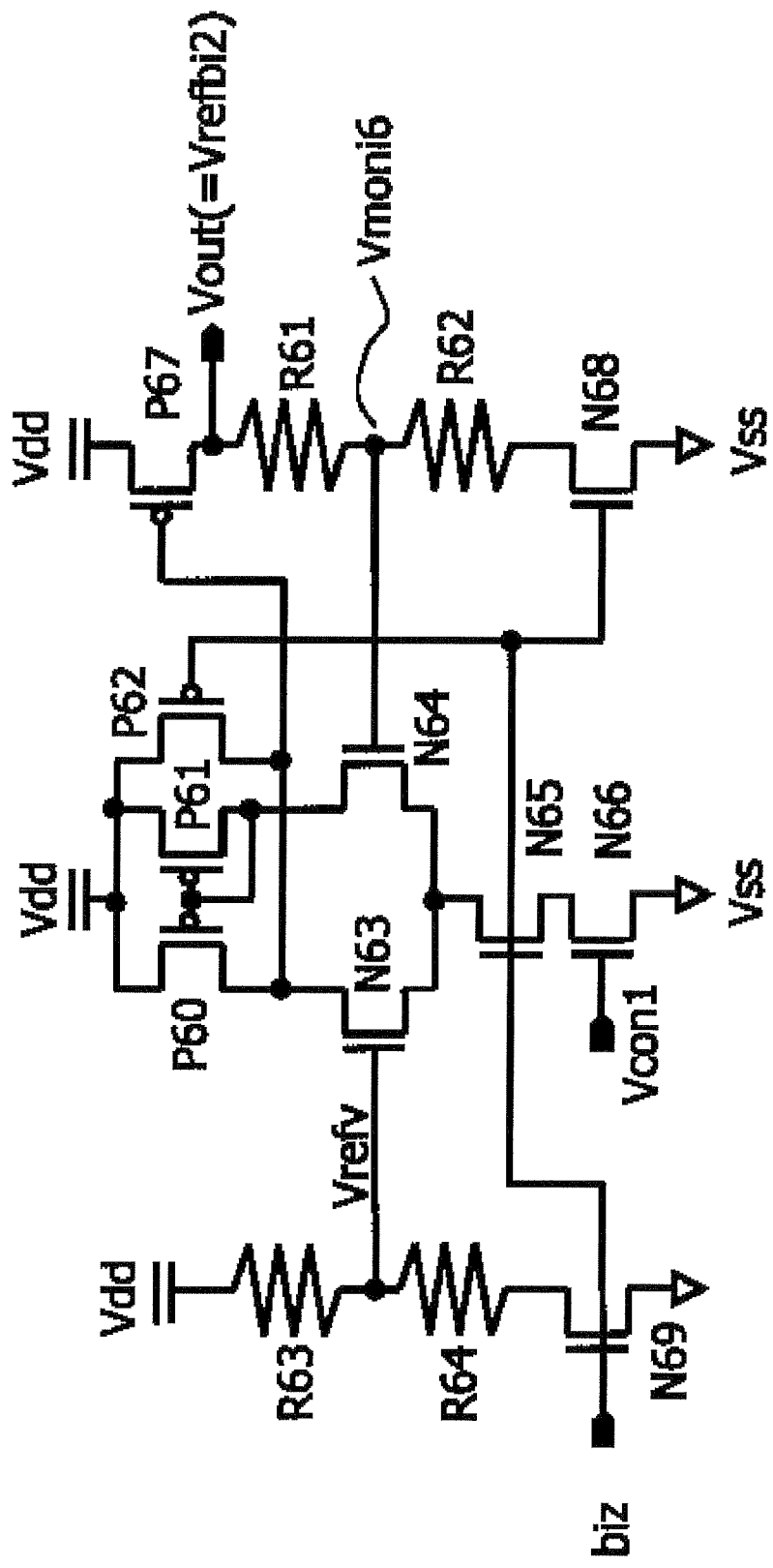
FIG. 15 is a circuit diagram showing one example of a second burn-in reference voltage generating circuit.

However, since the burn-in reference voltage Vrefbi is higher than that for the normal operation, the bias voltage bias and the delay circuit internal power-supply voltage Vid which are generated based on the burn-in reference voltage Vrefbi also become high. As shown in FIG. 9, the bias voltage bias and the internal power-supply voltage Vid are also high with respect to the external power-supply voltage Vddbi during the burn-in test. An increase in the bias voltage bias also increases the amount of current in the differential amplifier circuit including the delay circuit 18 (FIG. 3) and the detection circuit 15 (FIG. 15). The power-supply voltage Vid of the delay circuit 18 also increases. Thus, the delay time of the delay circuit 18 differs from that for the normal operation and the timing of a timing control signal generated by the delay circuit 18 differs from the timing of a timing controlling signal generated during the normal operation. In addition, the differential amplification operation in an appropriate operation range is not ensured because of an increase in the amount of current in the differential amplifier circuit in the detection circuit, and thus, malfunction can occur.

Accordingly, in the present embodiment, the reference-voltage generating unit generates a normal reference voltage Vrefnr that is independent of the potential of the external power-supply voltage Vdd during the normal operation and generates a first burn-in reference voltage that is dependent on the external power-supply voltage Vdd and a second burn-in reference voltage that has the same potential as the normal reference voltage Vrefnr. During the burn-in acceleration test, the first burn-in reference voltage is supplied to the Vpp generating circuit and the second burn-in reference voltage is supplied to the Vid generating circuit and the current-source-bias generating circuit.

Alternatively, in the first embodiment, the reference-voltage generating unit generates a normal reference voltage that is independent of the potential of the external power-supply voltage during the normal operation and generates a first burn-in reference voltage that is dependent on the potential of the external power-supply voltage and a second burn-in reference voltage that is dependent on the potential of the external power-supply voltage and that is lower than the first burn-in reference voltage. In this case, the first burn-in reference voltage is also supplied to the Vpp generating circuit and the second burn-in reference voltage is supplied to the Vid generating circuit and the current-source-bias generating circuit, as in the case described above.

In addition, in a second embodiment, the reference-voltage generating unit generates a normal reference voltage Vrefnr that is independent of the potential of the external power-supply voltage during the normal operation and generates a first burn-in reference voltage and a normal reference voltage that are dependent on the external power-supply voltage during the burn-in acceleration test. During the burn-in acceleration test, the first burn-in reference voltage is supplied to the Vpp generating circuit and the normal reference voltage is supplied to the Vid generating circuit and the current-source-bias generating circuit. A more specific description will be given below.

Figure 14:
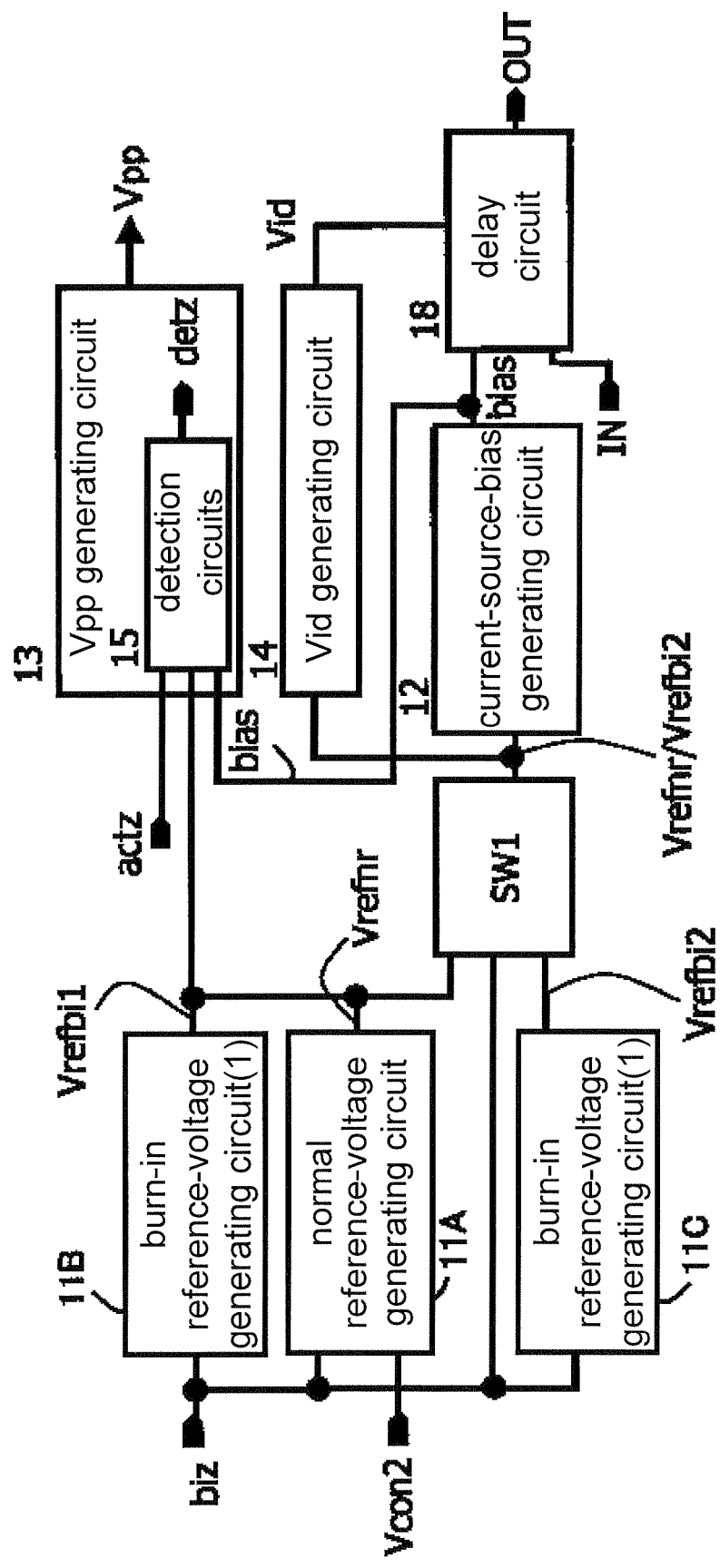
FIG. 14 is a block diagram of an internal power-supply circuit in a first embodiment.

FIG. 14 is a block diagram of an internal power-supply circuit according to the first embodiment. In the first embodiment, the reference-voltage generating unit 11 has a normal-reference-voltage generating circuit 11A, a first burn-in reference voltage generating circuit 11B, and a second burn-in reference voltage generating circuit 11C. The normal-reference-voltage generating circuit 11A is activated during the normal operation to generate a normal reference voltage Vrefnr. The first burn-in reference voltage generating circuit 11B is activated during the burn-in acceleration test to generate a first burn-in reference voltage Vrefbi1 that is dependent on the external power-supply voltage Vdd. The second burn-in reference voltage generating circuit 11C is also activated during the burn-in acceleration test to generate a second burn-in reference voltage Vrefbi2. The second burn-in reference voltage Vrefbi2 has the same potential as the normal reference voltage Vrefnr, generated during the normal operation, with respect to the burn-in external power-supply voltage Vddbi applied during the burn-in acceleration test. The second burn-in reference voltage Vrefbi2 has a lower potential than the first burn-in reference voltage Vrefbi1.

The reference-voltage generating unit 11 further has a switch SW1 that is operated in response to the burn-in control signal biz. During the normal operation, the switch SW1 selects the normal reference voltage Vrefnr to supply it to the Vid generating circuit 14 and the current-source-bias generating circuit 12. On the other hand, during the burn-in acceleration test, the switch SW1 selects the second burn-in reference voltage Vrefbi2 to supply it to the Vid generating circuit 14 and the current-source-bias generating circuit 12. During the normal operation, the normal reference voltage Vrefnr that is independent of the external power-supply voltage Vdd is supplied to the detection circuit 15 in the Vpp generating circuit 13. During the burn-in acceleration test, the first burn-in reference voltage Vrefbi1 that is dependent on the external power-supply voltage Vdd is supplied to the detection circuit 15.

Thus, during the burn-in acceleration test, the Vpp generating circuit 13 generates an internal power-supply step-up voltage Vpp that is higher than that for the normal operation in response to the external power-supply voltage Vdd, the Vid generating circuit 14 generates a delay-circuit internal power-supply voltage Vid that has the same potential as that for the normal operation, and the current-source-bias generating circuit 12 generates a bias voltage bias that has the same potential as that for the normal operation. Thus, during the burn-in acceleration test, it is possible to accelerate a defective portion in the memory core and to allow the detection circuit 15 and the delay circuit 18 to operate with the same characteristics as those for the normal operation.

The normal-reference-voltage generating circuit 11A has the same circuit configuration as the generating circuit shown in FIG. 11. Thus, the normal-reference-voltage generating circuit 11A is activated during the normal operation (i.e., at the low level of the burn-in control signal biz) to generate a normal reference voltage Vrefnr having a potential that is independent of the external power-supply voltage Vdd. During the burn-in acceleration test, the output Vout is put into a high impedance state.

The first burn-in reference voltage generating circuit 11B is one of the circuits shown in FIGS. 12 and 13. The first burn-in reference voltage generating circuit 11B is activated during the burn-in acceleration test (i.e., at the high level of the burn-in control signal biz) to generate a first burn-in reference voltage Vrefbi1 having a potential that is dependent on the potential of the external power-supply voltage Vdd. During the normal operation, the output Vout is put into a high impedance state.

The second burn-in reference voltage generating circuit 11C is one of the circuits shown in FIGS. 12 and 13, but the resistance ratio of the resistors is different from that of the first burn-in reference voltage generating circuit 11B. With respect to the burn-in external power-supply voltage Vdd supplied during the burn-in acceleration test, the second burn-in reference voltage Vrefbi2 is lower than the first burn-in reference voltage Vrefbi1 and has a potential that is the same as or similar to the normal reference voltage Vrefnr for the normal operation.

FIG. 15 is a circuit diagram showing one example of the second burn-in reference voltage generating circuit 11C. This circuit diagram is analogous to the circuit diagram shown in FIG. 12, but the reference numerals of the devices are different and the resistance ratio of the resistors R63 and R64 or the resistance ratio of the resistors R61 and R62 is different from that in FIG. 12. For example, the resistance ratio is given by R64/(R63+R64)<R43(R43+R44), and the reference voltage is given by Vrefv (FIG. 15) <Vrefv (FIG. 12). Consequently, Vrefbi1>Vrefbi2=Vrefnr is given.

The second burn-in reference voltage generating circuit 11C may be the same circuit shown in FIG. 13. In such a case, the resistance ratio of the resistors R51 and R52 is different and Vrefbi1>Vrefbi2=Vrefnr is given.

Figure 16:
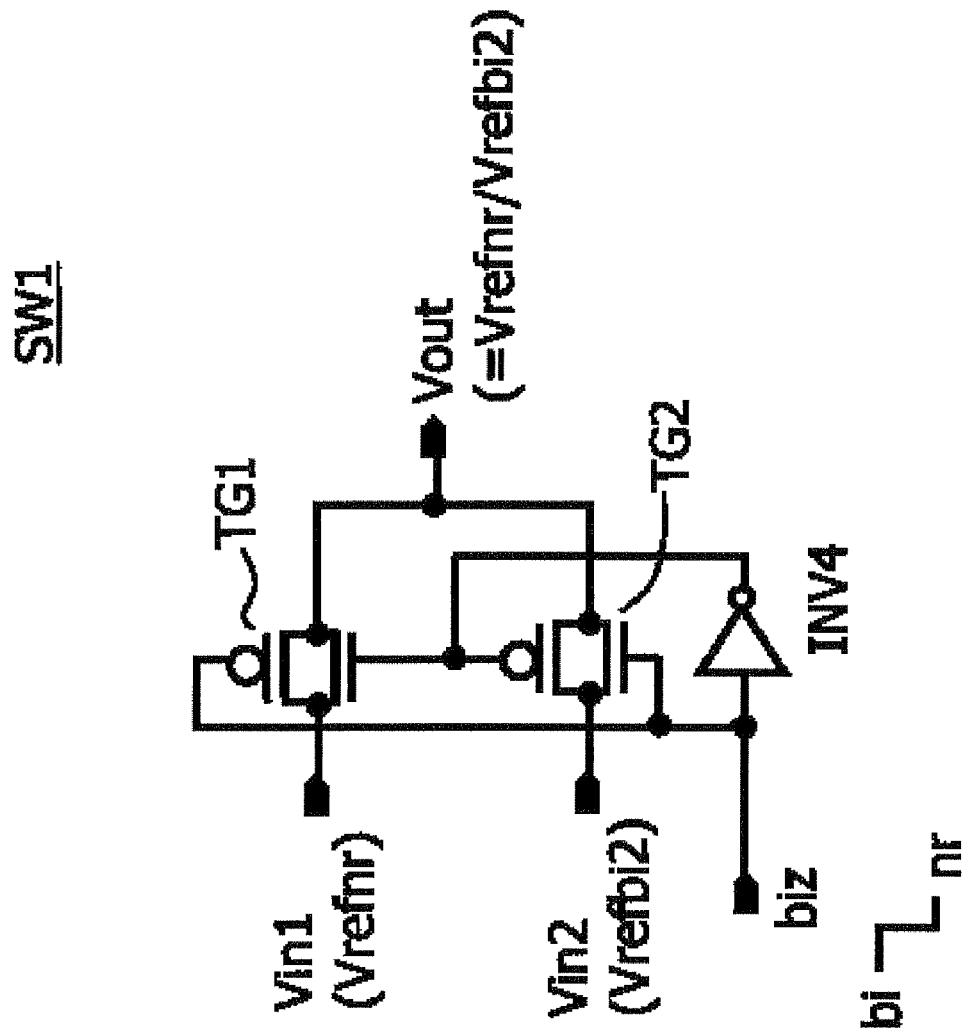
FIG. 16 is a circuit diagram of a switch.

FIG. 16 is a circuit diagram of the switch SW1. The switch SW1 has CMOS transfer gates TG1 and TG2 and an inverter INV4. During the normal operation (i.e., at the low level of the burn-in control signal biz), the gate TG1 is brought into conduction to connect a first input Vin1 to an output Vout. During the normal operation, the normal reference voltage Vrefnr is input to the first input Vin. On the other hand, during the burn-in acceleration test (i.e., at the high level of the burn-in control signal biz), the gate TG2 is brought into conduction to connect a second input Vin2 to the output Vout. During the burn-in acceleration test, the second burn-in reference voltage Vrefbi2 is input to the second input Vin2.

As described above, during the normal operation, the switch SW1 selects the normal reference voltage Vrefnr to supply it to the Vid generating circuit 14 and the current-source-bias generating circuit 12. On the other hand, during the burn-in acceleration test, the switch SW1 selects the second burn-in reference voltage Vrefbi2 to supply it to the Vid generating circuit 14 and the current-source-bias generating circuit 12.

Figure 17:
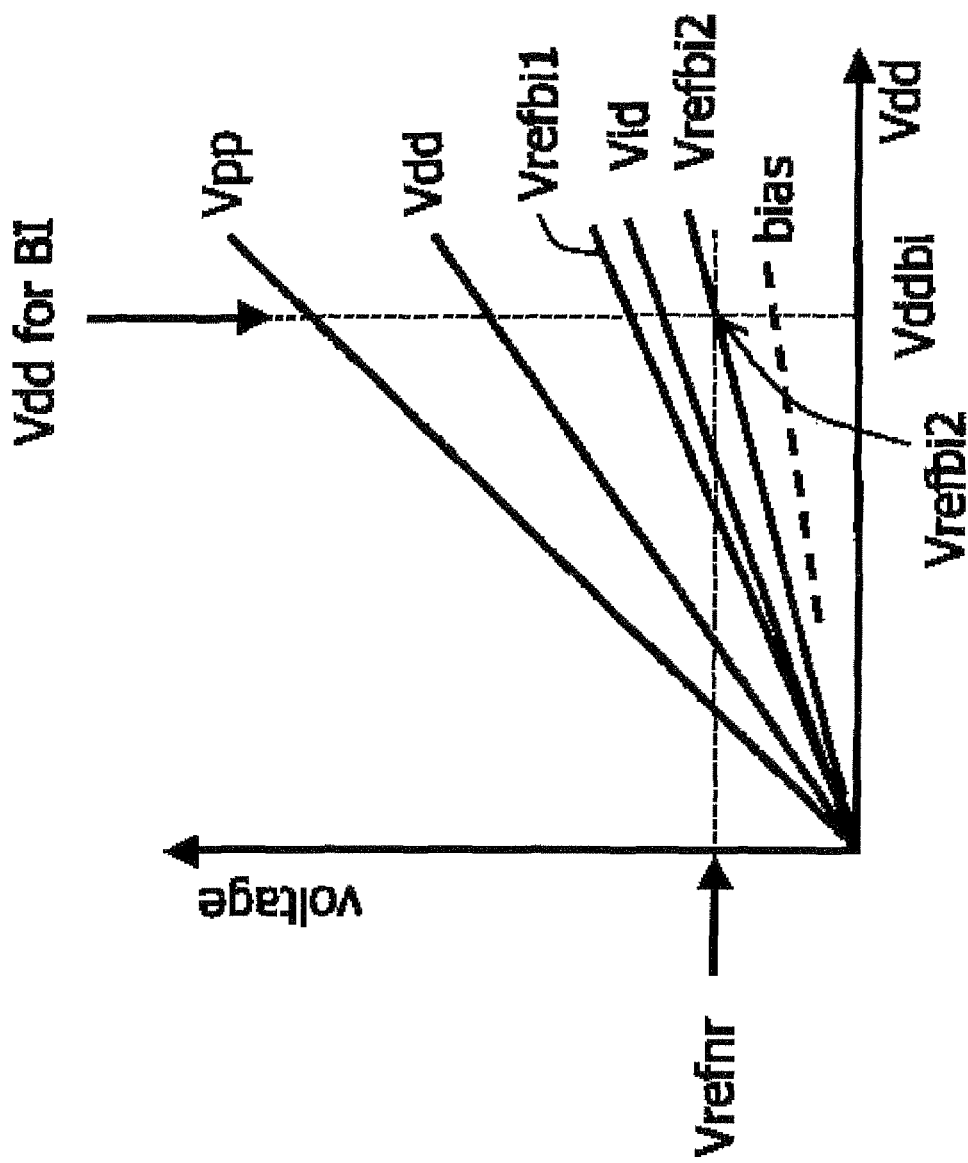
FIG. 17 is a graph showing relationships of the external power-supply voltage and the internal power-supply voltages during the burn-in acceleration test in the first embodiment.

FIG. 17 is a graph showing relationships of the external power-supply voltage and the internal power-supply voltages during the burn-in acceleration test in the first embodiment. As described above, the first and second burn-in reference voltages Vrefbi1 and Vrefbi2 have potentials that are dependent on the external power-supply voltage Vdd, as described above, but the gradients of the potentials thereof are different from each other. Thus, Vrefbi1>Vrefbi2 is given with respect to the burn-in external power-supply voltage Vddbi.

During the burn-in acceleration test, the external power-supply voltage Vdd is controlled so that it is higher than that for the normal operation. Thus, the first burn-in reference voltage Vrefbi1, which is dependent on the external power-supply voltage Vddbi, is also higher than the normal reference voltage Vrefnr applied during the normal operation. Since the first burn-in reference voltage Vrefbi1 is input to the detection circuit 15 in the Vpp generating circuit 13, the internal power-supply step-up voltage Vpp generated based on the reference voltage Vrefbi1 is higher than that supplied during the normal operation.

On the other hand, the second burn-in reference voltage Vrefbi2 is dependent on the external power-supply voltage Vddbi, and is set so that second-burn-in reference voltage Vrefbi2 is lower than the first burn-in reference voltage Vrefbi1, preferably, has the same potential as the normal reference voltage Vrefnr. Thus, the internal power-supply voltage Vid and the bias voltage bias, which are generated based on the second burn-in reference voltage Vrefbi2, have potentials that are the same as or similar to those for the normal operation. Thus, the current values of the current sources in the detection circuit 15 and the delay circuit 18 are the same as or similar to those for the normal operation and the delay-circuit internal power-supply voltage Vid is also the same as or similar to that for the normal operation. With this arrangement, the detection circuit 15 has an operation characteristic that is the same as or similar to the operation characteristic for the normal operation and the delay circuit 18 also has a delay characteristic that is the same as or similar to the delay characteristic for the normal operation. Since the delay value of the delay circuit 18 is the same as or similar to that for the normal operation, it is possible to reproduce an internal operation that is the same as or similar to that for the normal operation, and the operation of the differential amplifier circuit in the detection circuit 15 becomes almost the same as the operation for the normal operation.

Figure 18:
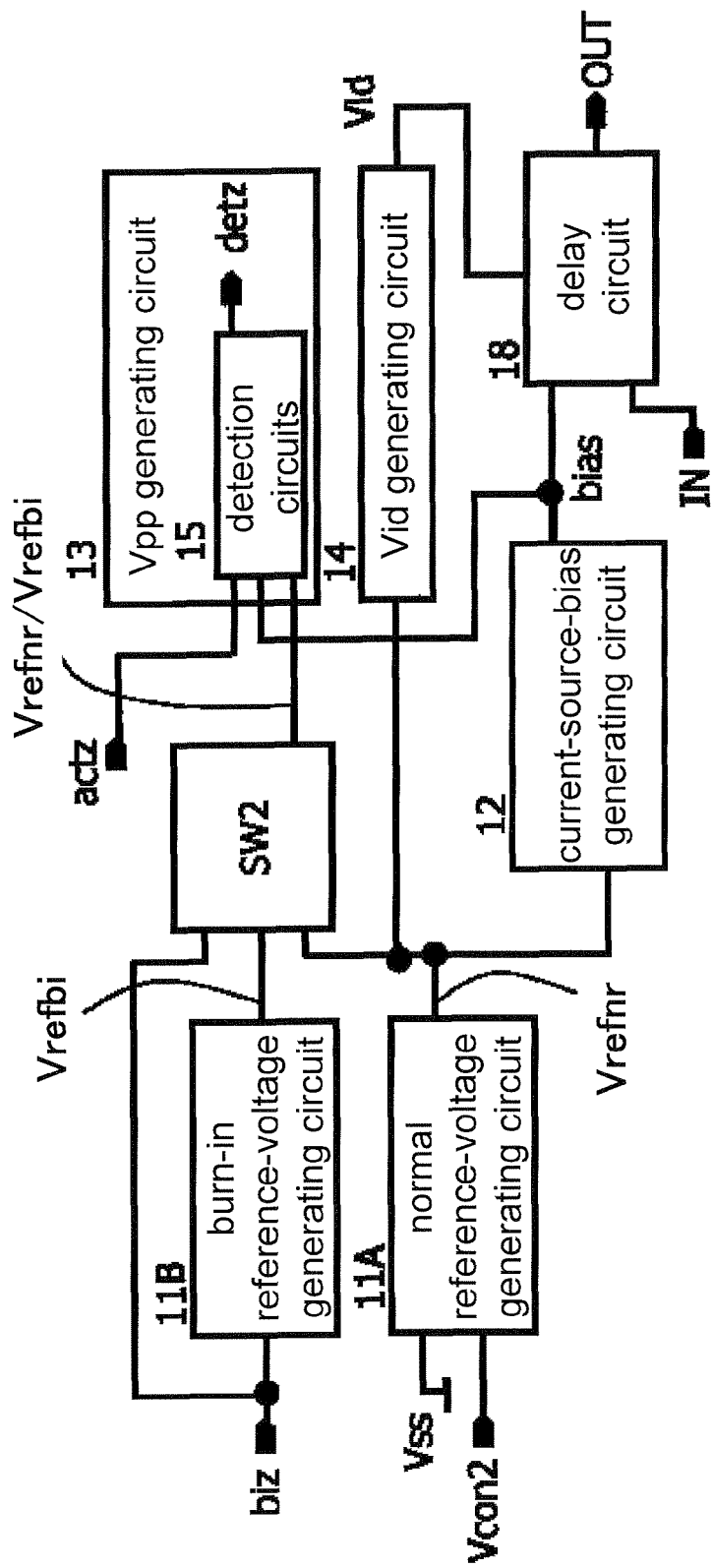
FIG. 18 is a block diagram of an internal power-supply circuit in a second embodiment.

FIG. 18 is a block diagram of the internal power-supply circuit in the second embodiment. In the second embodiment, the reference-voltage generating unit 11 has a normal-reference-voltage generating circuit 11A that is activated during both the normal operation and the burn-in acceleration test to generate a normal reference voltage Vrefnr and a burn-in reference voltage generating circuit 11B that is activated during the burn-in acceleration test to generate a burn-in reference voltage Vrefbi that is dependent on the external power-supply voltage Vdd.

The reference-voltage generating unit 11 further has a switch SW2 that is operated in response to the burn-in control signal biz. During the normal operation, the switch SW2 selects the normal reference voltage Vrefnr to supply it to the detection circuit 15 in the Vpp generating circuit 13. On the other hand, during the burn-in acceleration test, the switch SW2 selects the burn-in reference voltage Vrefbi to supply it to the detection circuit 15 in the Vpp generating circuit 13.

During either of the normal operation and the burn-in acceleration test, the normal reference voltage Vrefnr that is independent of the external power-supply voltage Vdd is supplied to the Vid generating circuit 14 and the current-source-bias generating circuit 12.

During the burn-in acceleration test, the Vpp generating circuit 13 generates an internal power-supply step-up voltage Vpp that is dependent on the external power-supply voltage Vdd and is higher than that supplied during the normal operation, and the Vid generating circuit 14 generates a delay-circuit internal power-supply voltage Vid that has the same potential as that for the normal operation and the current-source-bias generating circuit 12 also generates a bias voltage bias that has the same potential as that for the normal operation. Thus, during the burn-in acceleration test, it is possible to accelerate a defective portion in the memory core and to allow the detection circuit 15 and the delay circuit 18 to operate with the same characteristics as those for the normal operation.

The normal-reference-voltage generating circuit 11A has the same circuit configuration as the circuit shown in FIG. 11. The burn-in control signal biz is fixed to the low level, and thus, the normal reference voltage generating circuit 11A is always active. The burn-in reference voltage generating circuit 11B is one of the circuits shown in FIGS. 12 and 13 and is activated when the burn-in control signal biz is at the high level.

Figure 19:
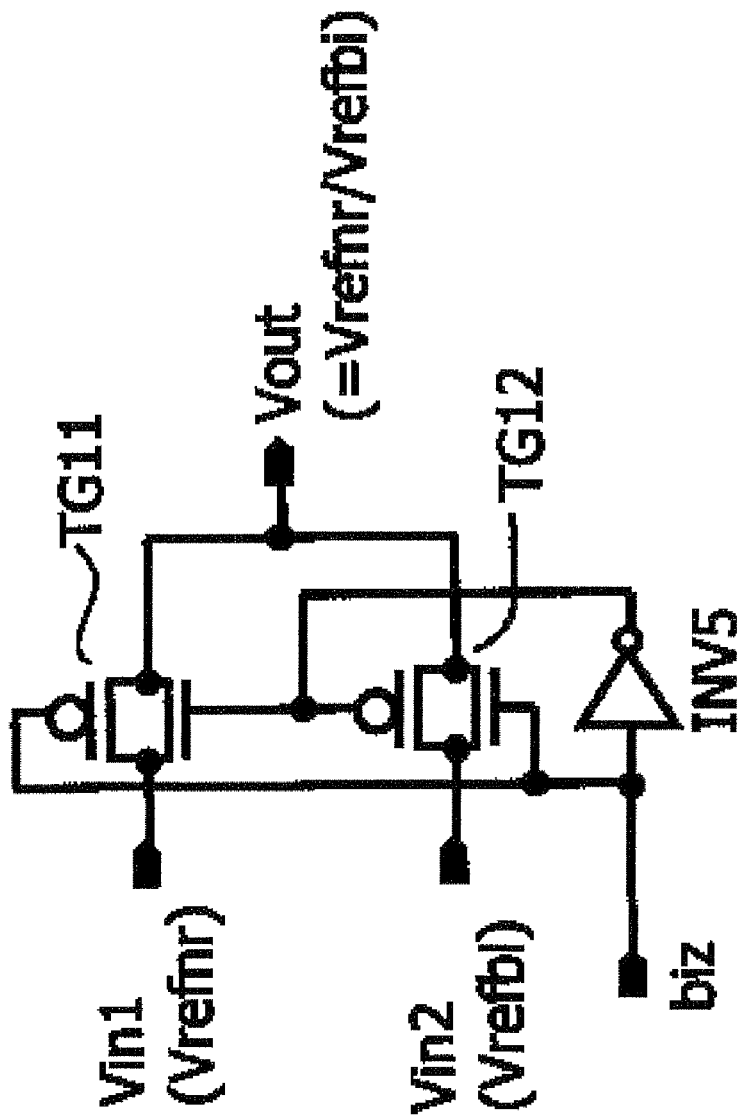
FIG. 19 is a circuit diagram of a switch.

FIG. 19 is a circuit diagram of the switch SW2. The switch SW2 has CMOS transfer gates TG11 and TG12 and an inverter INV5. During the normal operation (i.e., at the low level of the burn-in control signal biz), the gate TG11 is brought into conduction to connect a first input Vin1 to an output Vout. During the normal operation, the normal reference voltage Vrefnr is input to the first input Vin1. On the other hand, during the burn-in acceleration test (i.e., at the high level of the burn-in control signal biz), the gate TG12 is brought into conduction to connect a second input Vin2 to the output Vout. During the burn-in acceleration test, the burn-in reference voltage Vrefbi is input to the second input Vin2.

As described above, during the normal operation, the switch SW2 selects the normal reference voltage Vrefnr to supply it to the detection circuit 15 in the Vpp generating circuit 13. On the other hand, during the burn-in acceleration test, the switch SW2 selects the burn-in reference voltage Vrefbi2 to supply it to the detection circuit 15 in the Vpp generating circuit 13.

Figure 20:
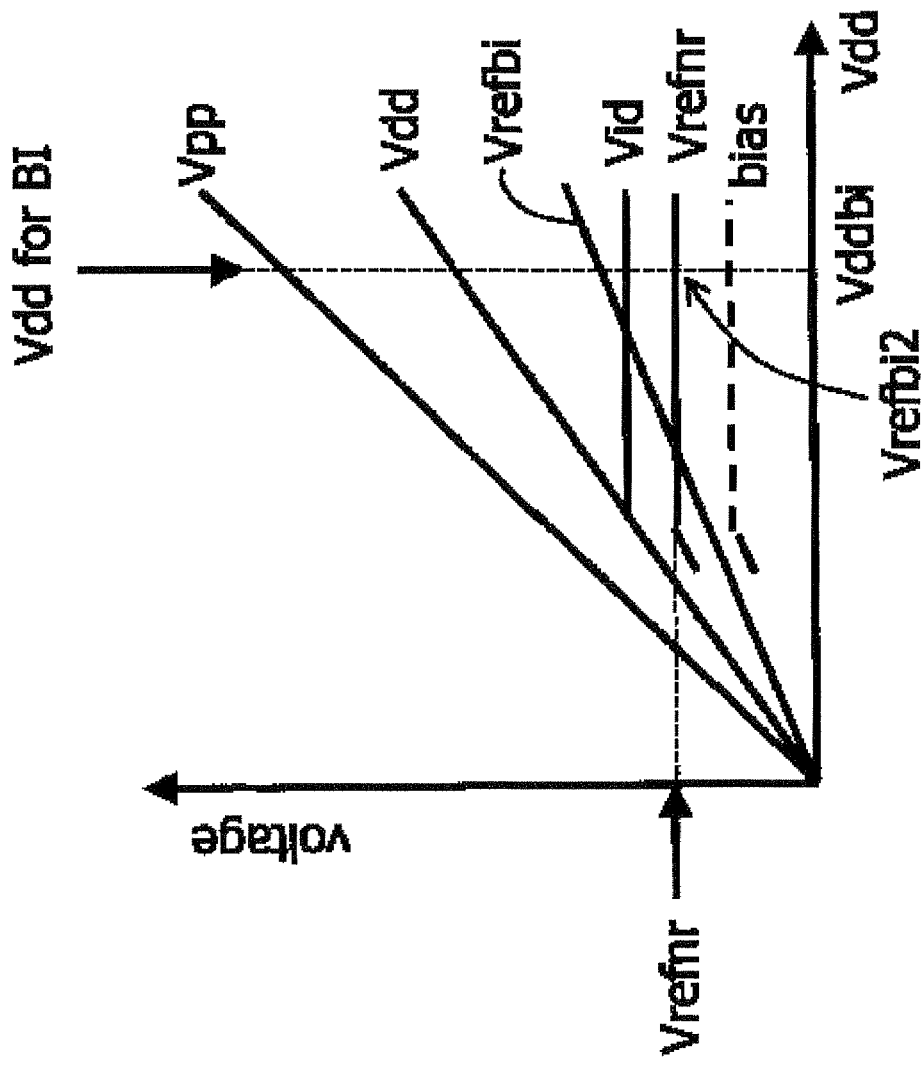
FIG. 20 is a graph showing relationships of the external power-supply voltage and the internal power-supply voltages during the burn-in acceleration test in the second embodiment.

FIG. 20 is a graph showing the external power source and the external power sources during the burn-in acceleration test. During the burn-in acceleration test, the external power-supply voltage Vdd is controlled to be Vddbi that is hither than that for the normal operation, and the burn-in reference voltage Vrefbi that depends on Vddbi becomes higher than the normal reference voltage Vrefnr. On the other hand, the normal reference voltage Vrefnr has a fixed potential that does not depend on the external power-supply voltage Vdd, and the delay-circuit internal power-supply voltage Vid and the bias voltage bias generated based on the normal reference voltage Vrefnr have fixed potentials. The voltages have the same potentials as those for the normal operation. That is, the normal reference voltage Vrefnr has a potential that is the same as or similar to the second burn-in reference voltage Vrefbi2 generated with respect to the burn-in external power-supply voltage Vddbi in the first embodiment.

The resistance values in the normal-reference-voltage generating circuit may be trimmed based on the result of an operation test. In this case, at the stage of the operation test in a burn-in acceleration test before trimming, the normal reference voltage Vrefnr is not completely the same as that for the normal operation. In view of this point, it is more advantageous to provide a second burn-in reference voltage generating circuit, as in the first embodiment, to generate a reference voltage (a design value) during the normal operation based on the burn-in external power-supply voltage Vddbi. In the burn-in acceleration test after trimming, the first and second embodiments provide similar advantages.

What is claimed is:

1. An internal power-supply circuit for generating an internal voltage based on a reference voltage, the internal power-supply circuit comprising:
    a reference-voltage generating unit for generating the reference voltage from an external power-supply voltage which is applied externally, the reference-voltage generating unit receiving a burn-in control signal which is asserted during a burn-in test and negated during a normal operation; and
    an internal-voltage generating unit for generating, upon receiving the reference voltage, the internal voltage based on the reference voltage,
    wherein during the normal operation, the reference-voltage generating unit generates a normal reference voltage that is independent of variation in the external power-supply voltage and the external power-supply voltage has a first potential,
    wherein during the burn-in acceleration test, the reference-voltage generating unit generates a first burn-in reference voltage that is dependent on variation in the external power-supply voltage and a second burn-in reference voltage that has the same potential as the normal reference voltage, and the external power-supply voltage has a second potential that is higher than the first potential during the burn-in acceleration test,
    wherein the reference-voltage generating unit includes
    a normal-reference-voltage generating circuit that is activated during the normal operation to generate the normal reference voltage,
    a first burn-in reference voltage generating circuit that is activated during the burn-in acceleration test to generate the first burn-in reference voltage, and
    a second burn-in reference voltage generating circuit that is activated during the burn-in acceleration test to generate the second burn-in reference voltage.

2. The internal power-supply circuit according to claim 1, wherein the normal-reference-voltage generating circuit has a differential amplifier circuit for comparing a constant voltage that is independent of the potential of the external power-supply voltage with a voltage that has a relationship of a first ratio relative to the normal reference voltage and for outputting the normal reference voltage;
    the first burn-in reference voltage generating circuit has a first differential amplifier circuit for comparing a voltage having a relationship of a second ratio relative to the external power-supply voltage with a voltage having a relationship of a third ratio relative to the first burn-in reference voltage and for outputting the first burn-in reference voltage;
    the second burn-in reference voltage generating circuit has a second differential amplifier circuit for comparing a voltage having a relationship of a fourth ratio relative to the external power-supply voltage with a voltage having a relationship of a fifth ratio relative to the second burn-in reference voltage and for outputting the second burn-in reference voltage; and
    the first burn-in reference voltage has a higher potential than the second burn-in reference voltage.

3. An internal power-supply circuit for generating an internal voltage based on a reference voltage, the internal power-supply circuit comprising:
    a reference-voltage generating unit for generating the reference voltage from an external power-supply voltage which is applied externally, the reference-voltage generating unit receiving a burn-in control signal which is asserted during a burn-in test and negated during a normal operation; and
    an internal-voltage generating unit for generating, upon receiving the reference voltage, the internal voltage based on the reference voltage,
    wherein during the normal operation, the reference-voltage generating unit generates a normal reference voltage that is independent of variation in the external power-supply voltage and the external power-supply voltage has a first potential,
    wherein during the burn-in acceleration test, the reference-voltage generating unit generates a first burn-in reference voltage that is dependent on variation in the external power-supply voltage and a second burn-in reference voltage that has the same potential as the normal reference voltage, and the external power-supply voltage has a second potential that is higher than the first potential during the burn-in acceleration test,
    wherein the internal-voltage generating unit includes a current-source-bias generating circuit for generating, based on at least the reference voltage, a current-source-bias voltage to be supplied to a current-source transistor,
    wherein, during the normal operation, the normal reference voltage is supplied to the current-source-bias generating circuit, and during the burn-in acceleration test, the second burn-in reference voltage is supplied to the current-source-bias generating circuit.

4. An internal power-supply circuit for generating an internal voltage based on a reference voltage, the internal power-supply circuit comprising:
- a reference-voltage generating unit for generating the reference voltage from an external power-supply voltage which is applied externally, the reference-voltage generating unit receiving a burn-in control signal which is asserted during a burn-in test and negated during a normal operation; and
- an internal-voltage generating unit for generating, upon receiving the reference voltage, the internal voltage based on the reference voltage,
- wherein during the normal operation, the reference-voltage generating unit generates a normal reference voltage that is independent of variation in the external power-supply voltage and the external power-supply voltage has a first potential,
- wherein during the burn-in acceleration test, the reference-voltage generating unit generates a first burn-in reference voltage that is dependent on variation in the external power-supply voltage and a second burn-in reference voltage that has the same potential as the normal reference voltage, and the external power-supply voltage has a second potential that is higher than the first potential during the burn-in acceleration test,
- wherein the internal-voltage generating unit includes
  - an internal power-supply step-up voltage generating circuit for generating, based on the reference voltage, an internal power-supply step-up voltage having a higher potential than the external power-supply voltage, and
  - a delay-circuit power-supply voltage generating circuit for generating a delay-circuit power-supply voltage based on the reference voltage,
  - wherein during the normal operation, the normal reference voltage is supplied to the internal power-supply step-up voltage generating circuit and the delay-circuit power-supply voltage generating circuit, and
  - during the burn-in acceleration test, the first burn-in reference voltage is supplied to the internal power-supply step-up voltage generating circuit and the second burn-in reference voltage is supplied to the delay-circuit power-supply voltage generating circuit.

5. The internal power-supply circuit according to claim 4, wherein the delay-circuit power-supply voltage is supplied to a delay circuit and the delay circuit has a delay characteristic corresponding to a potential of the delay-circuit power-supply voltage.

6. An internal power-supply circuit for generating an internal voltage based on a reference voltage, the internal power-supply circuit comprising:
- a reference-voltage generating unit for generating the reference voltage from an external power-supply voltage which is applied, the reference-voltage generating unit receiving a burn-in control signal which is asserted during a burn-in test and negated during a normal operation; and
- an internal-voltage generating unit for generating, upon receiving the reference voltage, the internal voltage based on the reference voltage,
- wherein the external power-supply voltage has a first predetermined potential during a normal operation and has a second potential that is higher than the first potential during the burn-in acceleration test,
- wherein the reference-voltage generating unit generates, during the normal operation, a normal reference voltage that is independent of variation in the external power-supply voltage and generates, during the burn-in acceleration test, a first burn-in reference voltage that is dependent on variation in the external power-supply voltage and a second burn-in reference voltage that is dependent on variation in the external power-supply voltage and that is lower than the first burn-in reference voltage, and
- the internal-voltage generating unit has a current-source-bias generating circuit for generating, based on at least the reference voltage, a current-source-bias voltage to be supplied to a current-source transistor, wherein, during the normal operation, the normal reference voltage is supplied to the current-source-bias generating circuit, and during the burn-in acceleration test, the second burn-in reference voltage is supplied to the current-source-bias generating circuit.

7. The internal power-supply circuit according to claim 6, wherein the reference-voltage generating unit has
- a normal-reference-voltage generating circuit that is activated during the normal operation to generate the normal reference voltage,
- a first burn-in reference voltage generating circuit that is activated during the burn-in acceleration test to generate the first burn-in reference voltage, and
- a second burn-in reference voltage generating circuit that is activated during the burn-in acceleration test to generate the second burn-in reference voltage,
- wherein the reference-voltage generating unit outputs the normal reference voltage during the normal operation and outputs the first and second burn-in reference voltages during the burn-in acceleration test.

8. The internal power-supply circuit for generating an internal voltage based on a reference voltage, the internal power-supply circuit comprising:
- a reference-voltage generating unit for generating the reference voltage from the external power-supply voltage which is applied externally, the reference-voltage generating unit receiving a burn-in control signal which is asserted during a burn-in test and negated during a normal operation; and
- an internal-voltage generating unit for generating, upon receiving the reference voltage, the internal voltage based on the reference voltage,
- wherein the external power-supply voltage has a first potential during a normal operation and has a second predetermined potential that is higher than the first potential during the burn-in acceleration test,
- wherein the reference-voltage generating unit generates, during the normal operation, a normal reference voltage that is independent of the external power-supply voltage and generates, during the burn-in acceleration test, the normal reference voltage and a first burn-in reference voltage that is dependent on variation in the external power-supply voltage,
- wherein the internal-voltage generating unit includes:
- an internal power-supply step-up voltage generating circuit for generating, based on the reference voltage, an internal power-supply step-up voltage having a higher potential than the external power-supply voltage, and
- a current-source-bias generating circuit for generating, based on the reference voltage, a current-source-bias voltage to be supplied to a current-source transistor,
- wherein during the normal operation, the normal reference voltage is supplied to the internal power-supply step-up voltage generating circuit and the current-source-bias generating circuit, and during the burn-in acceleration test, the first burn-in reference voltage is supplied to the internal power-supply step-up voltage generating circuit and the normal reference voltage is supplied to the current-source-bias generating circuit.

9. The internal power-supply circuit according to claim 8, wherein the current-source-bias voltage is supplied to a current-source transistor in a delay circuit or a current-source transistor in a power-supply step-up voltage detection circuit in an internal power-supply step-up voltage generating circuit to cause the current-source transistor to generate current corresponding to the current-source-bias voltage.

* * * * *